(12) United States Patent
Perois et al.

(10) Patent No.: US 9,596,546 B2
(45) Date of Patent: Mar. 14, 2017

(54) ELECTROACOUSTIC COMPONENTS AND METHODS THEREOF

(71) Applicant: EPCOS AG, Munich (DE)

(72) Inventors: Xavier Perois, Mouans Sartoux (FR); Sylvain Jean Ballandras, Besancon (FR)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 14/652,092

(22) PCT Filed: Dec. 12, 2012

(86) PCT No.: PCT/EP2012/075279
§ 371 (c)(1),
(2) Date: Jun. 12, 2015

(87) PCT Pub. No.: WO2014/090302
PCT Pub. Date: Jun. 19, 2014

(65) Prior Publication Data
US 2015/0319537 A1    Nov. 5, 2015

(51) Int. Cl.
*H03H 9/02* (2006.01)
*H04R 17/00* (2006.01)
*H04R 1/00* (2006.01)

(52) U.S. Cl.
CPC ......... *H04R 17/00* (2013.01); *H03H 9/02228* (2013.01); *H03H 9/02559* (2013.01); *H03H 9/02574* (2013.01); *H03H 9/02834* (2013.01); *H04R 1/00* (2013.01)

(58) Field of Classification Search
CPC ........... H03H 9/02228; H03H 9/02559; H03H 9/02834; H03H 9/02574

USPC ........................................................ 310/360
See application file for complete search history.

(56) References Cited

U.S. PATENT DOCUMENTS

| | | | |
|---|---|---|---|
| 7,345,409 B2 * | 3/2008 | Leidl | ................. H03H 9/02897 310/313 A |
| 2007/0028433 A1 | 2/2007 | Abbott et al. | |
| 2010/0038991 A1 | 2/2010 | Shih et al. | |
| 2010/0182102 A1 | 7/2010 | Kuypers et al. | |
| 2010/0327995 A1 | 12/2010 | Reinhardt et al. | |
| 2014/0009036 A1 | 1/2014 | Iwamoto | |
| 2014/0152146 A1 | 6/2014 | Kimura et al. | |

FOREIGN PATENT DOCUMENTS

| | | |
|---|---|---|
| EP | 2490333 A1 | 8/2012 |
| JP | 2012512597 A | 5/2012 |

(Continued)

OTHER PUBLICATIONS

Naumenko, N., "Mulitlayered Structure as a Novel Material for Surface Acoustic Wave Devices: Physical Insight," Acoustic Waves—From Microdevices to Helioseismology, Nov. 14, 2011m, pp. 442-443.

(Continued)

*Primary Examiner* — Derek Rosenau
(74) *Attorney, Agent, or Firm* — Slater Matsil, LLP

(57) ABSTRACT

An improved electroacoustic component is provided. The component includes a carrier wafer with a passivation layer, a piezoelectric layer above the passivation layer and an interdigitated transducer in an electrode layer on the piezoelectric layer. The component is configured to work with a shear mode.

35 Claims, 31 Drawing Sheets

(56) References Cited

FOREIGN PATENT DOCUMENTS

| | | |
|---|---|---|
| WO | 2012086441 A | 6/2012 |
| WO | 2012124648 A1 | 9/2012 |

OTHER PUBLICATIONS

Abbott, B. P., et al., "Characterization of Bonded Wafer for RF Filters with Reduced TCF," IEEE Ultrasonics Symposium, 2005, 4 pages.

* cited by examiner

ELECTROACOUSTIC COMPONENTS AND METHODS THEREOF

This patent application is a national phase filing under section 371 of PCT/EP2012/075279, filed Dec. 12, 2012, which is incorporated herein by reference in its entirety.

TECHNICAL FIELD

The present invention relates to electroacoustic components and methods thereof.

BACKGROUND

Electroacoustic components can be utilized in RF-filters, e.g. of mobile communication devices. The components can comprise a piezoelectric material and electrode structures. Utilizing the piezoelectric effect, the electrode structures can convert electromagnetic RF-signals into acoustic waves and vice versa. Due to the shorter wave length of acoustic waves compared to electromagnetic waves, such components allow small spatial dimensions. Thus, electroacoustic components are preferred in modern mobile communication devices where small spatial dimensions are desirable.

However, the physical interaction of RF-waves and acoustic waves with the piezoelectric material and the electrode structure is complex, and the number of parameters determining the behavior of the component is large. Such parameters may be, among others, the sound velocity, the frequency, the piezoelectric coupling coefficient. These parameters depend on material parameters like the type of the piezoelectric material, the orientation of the material, the material of the electrodes, layer thicknesses, etc. Thus, the dependency of the parameters is also complex, and a change of one parameter usually demands for a change of the other parameters, too, in order to obtain an electroacoustic component with properties satisfying hosting system requirements.

SUMMARY

Embodiments of the present invention provide an electroacoustic component with such physical and electric properties, e.g. a small thickness, little insertion loss, a frequency-temperature compensation, a high coupling coefficient, a wide-band capability, a high quality factor and a good spectral purity. Embodiments of the present invention further provide a method for manufacturing such a device.

In the text below numeric values are provided. Tolerance on these numerical values can be in a range of 5% to 10%.

In one embodiment, the electroacoustic component comprises a carrier wafer with a piezoelectric layer above the carrier wafer and an interdigitated transducer in an electrode layer on the piezoelectric layer.

It is possible that a passivation layer is arranged between the carrier wafer and the piezoelectric layer. The passivation layer can comprise $SiO_2$ (silicon dioxide, silica) and reduce the temperature coefficient of frequencies (TCF). I.e. the passivation layer can bring about an improved frequency-temperature compensation. The passivation layer can be amorphous and have a thickness of 1 µm. It is preferably pure, e.g. without ionic pollution, and dense to provide elastic properties of the layer as close as possible from the ones of the bulk material.

It is further possible that the component is designated or configured to work with a particular type of acoustic wave as a main acoustic wave. The wave can be a shear wave or a Rayleigh wave. However, a shear wave is preferred for various reasons discussed hereafter. Particularly, the capability of the piezoelectric layer used to excite and detect the waves to excite a single mode is particularly wanted, to promote the spectral purity of the resulting spectrum.

The carrier wafer can comprise Si (silicon) and can be a single crystal Si wafer.

The piezoelectric material can comprise $LiNbO_3$ (lithium niobate) or $LiTaO_3$ (lithium tantalate). The piezoelectric material can be a single crystal material bonded on a passivated Si wafer.

The interdigitated transducer can comprise an electrode grating structure, e.g., interdigitated electrode fingers connected to one of two busbars, or reflector structures.

The piezoelectric material on the carrier wafer establishes a wave-guiding structure in which acoustic waves can propagate.

In one embodiment, the piezoelectric layer comprises a lithium niobate single crystal substrate. The substrate has a $(YX1)/\alpha$ cut with $50° \leq \alpha \leq 60°$. The thickness of the substrate is 0.25 µm. The carrier wafer comprises silicon and the passivation layer comprises silicon dioxide and has a thickness of 0.25 µm.

A $(YX1)/\alpha$ cut is a cut where the substrate is rotated around the x-axis and x is the direction parallel to the piezoelectric axis of the piezoelectric layer. Details concerning the rotations of piezoelectric materials can be obtained from the IEEE Std-176 standard on piezoelectricity which provides objective definitions of the crystal axes and angular rotations. Then, a YX cut of crystal corresponds to a plate for which the width lies along the optical (Z) axis, the length along the so-called X crystallographic axis and the thickness along the Y axis in such a way that this later axis is normal to plate surface where the wave is expected to propagate. Therefore, the angle $\alpha$ corresponds to a rotation around the above-defined X axis, yielding specific properties to the substrate based on the angular combination of its intrinsic physical properties.

In this configuration, especially an angle $\alpha$ of 55° is preferable.

In one embodiment, the substrate has a $(YX1)/\alpha$ cut with $50° \leq \alpha \leq 60°$ and a thickness of 0.35 µm. The carrier wafer comprises silicon and the passivation layer comprises silicon dioxide and has a thickness of 0.25 µm. The piezoelectric layer comprises a lithium niobate single crystal substrate.

In one embodiment, the piezoelectric layer comprises a lithium niobate single crystal substrate having a $(YX1)/\alpha$ cut with $\alpha=55°$ and a thickness of 0.25 µm. The carrier wafer comprises silicon. The passivation layer comprises silicon dioxide and has a thickness of 0.25 µm.

In one embodiment, the piezoelectric layer comprises a lithium niobate single crystal substrate and has a $(YX1)/\alpha$ cut with $\alpha=55°$ and a thickness of 0.35 µm. The carrier wafer comprises silicon. The passivation layer comprises silicon dioxide and has a thickness of 0.55 µm.

In one embodiment, the piezoelectric layer comprises a lithium niobate single crystal substrate. The transducer has a metallization ratio of $\eta=0.5$ and a mechanical period $\lambda/2$ of 1.85 µm. The transducer further has a relative electrode height of $h:\lambda=0.01$. It is possible that the height of the electrode is $h=0.075$ µm. The substrate has a $(YX1)/\alpha$ cut with $\alpha=55°$ and a thickness of 0.35 µm. The carrier wafer comprises silicon. The passivation layer comprises silicon dioxide and has a thickness of 0.55 µm.

In one embodiment, the piezoelectric layer comprises a lithium niobate single crystal substrate. The transducer has a metallization ratio of $\eta=0.5$ and a mechanical period of 1.85 μm. The transducer has a relative electrode height of h:λ=0.01. The electrode height h can be 0.05 μm. The substrate has a (YX1)/α cut with α=55° and a thickness of 0.175 μm. The carrier wafer comprises silicon. The passivation layer comprises silicon dioxide and has a thickness of 0.275 μm.

In one embodiment, the piezoelectric layer comprises a lithium niobate single crystal substrate. The transducer has a metallization ratio of 0.4≤η≤0.5 and a mechanical period of 1.85 μm. The transducer further has a relative electrode height of h:λ=0.05. The electrode height h can be 0.350 μm. The substrate has a (YX1)/α cut with α=55° and a thickness of 0.35 μm. The carrier wafer comprises silicon. The passivation layer comprises silicon dioxide and has a thickness of 0.55 μm.

It is possible that the mechanical period varies within a range of +20% or −20% for each period, e.g. the period of 1.85 μm. With this degree of freedom for optimizing the period an advantage for dispersion properties of the waveguiding layer is obtained. The variation further allows to adjust the temperature coefficients of frequency.

In one embodiment, the piezoelectric layer comprises a lithium niobate single crystal substrate. The transducer has a metallization ratio of η=0.8. The substrate has a (YX1)/α cut with α=52°. The carrier wafer comprises silicon. The passivation layer comprises silicon dioxide.

In one embodiment, the piezoelectric layer comprises a lithium niobate single crystal substrate. The substrate has a (YX1)/α cut with α=52° and a thickness of 0.2 μm. The carrier wafer comprises silicon. The passivation layer comprises silicon dioxide and has a thickness of 0.4 μm.

In one embodiment, the transducer has a mechanical period of 1.85 μm+/−20%.

In one embodiment, the piezoelectric layer comprises a lithium niobate single crystal substrate. The substrate has a (YX1)/α cut with α=55° and a thickness of 0.35 μm. The carrier wafer comprises silicon. The passivation layer comprises silicon dioxide and has a thickness of 0.55 μm.

In one embodiment, the piezoelectric layer comprises a lithium niobate single crystal substrate. The substrate has a (YX1)/α cut with α=52° and a thickness of 0.2 μm. The carrier wafer comprises silicon. The passivation layer comprises silicon dioxide and has a thickness of 0.4 μm.

In one embodiment, the piezoelectric layer comprises a lithium tantalate single crystal substrate.

In one embodiment, the substrate has a (YX1)/α cut with α=48° and a thickness of 0.465 μm. The passivation layer comprises silicon dioxide and has a thickness of 0.1 μm. The transducer can have a mechanical period of 1.9 μm or a mechanical period of 1.9 μm+/−20%.

In one embodiment, the substrate has a (YX1)/α cut with α=55°. The passivation layer comprises silicon dioxide and has a thickness of 1.0 μm. The component is designated to work with LSAW (LSAW=Leaky SAW=leaky surface acoustic wave).

The carrier wafer has a thickness that may be 350 μm or larger. The thickness can be between 350 μm and 500 μm. However, thicknesses over 500 μm are also possible.

In one embodiment, the substrate has a (YX1)/α cut with α=48° and a thickness of 0.465 μm. The passivation layer comprises silicon dioxide and has a thickness of 1.0 μm.

In one embodiment, the carrier wafer is designated to be a wave-guiding material.

In one embodiment, the component comprises a Bragg mirror structure below the substrate.

In one embodiment, the carrier wafer comprises silicon, sapphire, or diamond-carbon.

In one embodiment, the substrate comprises lithium niobate and has a (YX1)/α cut with 45°≤α≤60° and a thickness of 1.1 μm. The passivation layer comprises silicon dioxide and has a thickness of 3 μm. The carrier wafer has a thickness equal to or larger than 350 μm.

In one embodiment, the substrate comprises lithium niobate and has a (YX1)/α cut with α=52°.

In one embodiment, the substrate comprises lithium niobate and has a (YX1)/α cut with α=52° and a thickness of 1.0 μm. The passivation layer comprises silicon dioxide and has a thickness of 1.0 μm. The carrier wafer has a thickness equal to or larger than 350 μm.

In one embodiment, the substrate comprises lithium niobate and has a (YX1)/α cut with α=52° and a thickness of 1.1 μm. The carrier wafer has a thickness equal to or larger than 350 μm.

In one embodiment, the substrate comprises lithium niobate and has a (YX1)/α cut with α=52°. The passivation layer comprises silicon dioxide and has a thickness of 1.5 μm. The carrier wafer has a thickness equal to or larger than 350 μm.

In one embodiment, the substrate comprises lithium niobate and has a (YX1)/α cut with α=52° and a thickness of 1.2 μm. The passivation layer comprises silicon dioxide and has a thickness of 1.5 μm. The carrier wafer has a thickness equal to or larger than 350 μm.

In one embodiment, the substrate comprises lithium niobate and has a (YX1)/α cut with α=52° and a thickness of 1.2 μm. The passivation layer comprises silicon dioxide and has a thickness equal to or larger than 4.0 μm. The carrier wafer has a thickness equal to or larger than 350 μm.

In one embodiment, the substrate comprises lithium tantalate and has a (YX1)/α cut with 48°≤α≤52°. The passivation layer comprises silicon dioxide. The thickness of the passivation layer is half of the thickness of the carrier wafer. The carrier wafer has a thickness equal to or larger than 350 μm.

In one embodiment, the substrate comprises lithium tantalate and has a (YX1)/α cut with 48°≤α≤52° and a thickness of 1.2 μm.

In one embodiment, the substrate comprises lithium tantalate and has a (YX1)/α cut with α=48° and a thickness of 1.2 μm. The passivation layer comprises silicon dioxide and has a thickness of 1.3 μm. The carrier wafer has a thickness equal to or larger than 350 μm.

In one embodiment, the substrate comprises lithium tantalate and has a (YX1)/α cut with α=48° and a thickness of 2 μm. The passivation layer comprises silicon dioxide and has a thickness of 1.5 μm. The carrier wafer has a thickness equal to or larger than 350 μm.

A carrier wafer with a thickness equal to or larger than 350 μm can be regarded as a semi-infinite substrate, i.e. the bottom of the substrate is mainly free of wave-induced dislocations or is processed in such a way that any reflection related to the radiation of acoustic waves from the top surface will be diffused an not reflected in phase toward the surface to prevent any unwanted interference.

In one embodiment, the substrate comprises lithium tantalate and has a (YX1)/α cut with α=48° and a thickness of 2 μm. The passivation layer comprises silicon dioxide and has a thickness of 2 μm. The carrier wafer has a thickness equal to or larger than 350 μm.

In one embodiment, the substrate comprises lithium niobate and has a thickness of 1.4 μm. The passivation layer comprises silicon dioxide and has a thickness of 5 μm. The transducer has a metallization ratio η being equal to or larger than 0.4 and not larger than 0.5. The transducer further has a relative electrode height h:λ=0.068. The carrier wafer has a thickness equal to or larger than 350 µm.

In one embodiment, the substrate comprises lithium niobate and has a thickness of 1.2 µm. The passivation layer comprises silicon dioxide and has a thickness of 5 µm. The transducer has a metallization ratio not smaller than 0.4 and not larger than 0.5. The transducer further has a relative electrode height h:λ=0.068. The carrier wafer has a thickness equal to or larger than 350 µm.

In one embodiment, the component is an RF-filter operating at a center frequency F between 1710 MHz and 1785 MHz. A method for determining optimized parameters of electroacoustic components comprises providing a simulation system capable of simulating the propagation of acoustic waves at an interface of a piezoelectric layer. The method further includes neglecting thermo-differential stress in at least one direction.

In this approach, one of the materials of the stack, e.g., the thicker one, forces the thermal expansion of the whole substrate along the propagation axis which is co-linear to the excitation surface whereas the expansion of the entire material stack along the normal to the substrate thickness is conform to their tabulated coefficients.

In one embodiment of the method, the simulation environment is a finite element system.

In one embodiment of the method, the simulation environment is capable of simulating non-linear physical properties.

In one embodiment of the method, the simulation environment is capable of dynamics analysis.

In one embodiment of the method, the simulation environment utilizes a Green's function.

In one embodiment of the method, the simulation approach combines finite element analysis and boundary integral methods, e.g. including boundary element analysis.

Further, it is possible that an electroacoustic component works with a higher order Lamb mode. Such a component comprises a carrier wafer and a piezoelectric layer above the carrier wafer. A passivation layer may be arranged between the carrier wafer and the piezoelectric layer.

The component further comprises an interdigitated transducer in an electrode layer. The electrode layer may be arranged on the piezoelectric layer. Further, the component comprises a Bragg mirror structure below the piezoelectric layer.

The passivation layer can be arranged on a substrate such as a Si substrate or a sapphire substrate.

Examples of electroacoustic components and their basic working principles together with computation results showing advanced properties of electroacoustic components are shown in the figures. Particularly, the figures indicate the advantages of the above mentioned angular sectors. The advantage of the considered sectors is that it is possible to excite only very small contributions of Rayleigh waves to the predicted spectrum of interdigitated transducers deposited above the piezoelectric layer.

DETAILED DESCRIPTION OF ILLUSTRATIVE EMBODIMENTS

Figure 1:
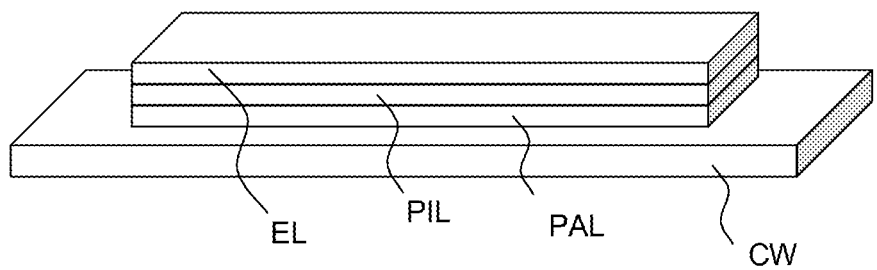
FIG. 1 shows a layer stack with a piezoelectric layer PIL over a carrier wafer CW.

FIG. 1 shows a layer stack with a carrier wafer CW. Above the carrier wafer CW, a piezoelectric layer PIL is arranged. Between the piezoelectric layer PIL and the carrier wafer CW, a passivation layer PAL is arranged. An electrode layer EL covers the piezoelectric layer PIL. In the electrode layer EL, electrode structures can be structured that convert between RF signals and acoustic waves.

Figure 2:
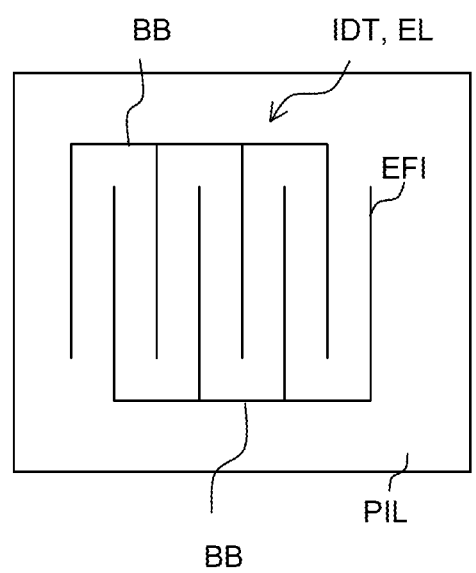
FIG. 2 shows an arrangement of an interdigitated transducer IDT on a piezoelectric layer PIL.

FIG. 2 shows a top view onto a schematic transducer IDT that may be structured into the electrode layer shown in FIG. 1. The transducer IDT comprises electrode fingers EFI being arranged next to each other. Each electrode finger EFI is connected to one of two bus bars BB. The transducer, thus, can be an interdigitated transducer IDT. The area of the piezoelectric layer which is provided for propagating acoustic waves is denoted as the acoustic track. The transducer is arranged in the acoustic track. Structured reflecting elements on one or on both sides of the acoustic track can be utilized to confine acoustic energy in the acoustic track.

The transducer can be a part of an electro-acoustic resonator. Electro-acoustic resonators can be electrically connected to form an RF-filter as shown in FIG. 3.

Figure 3:
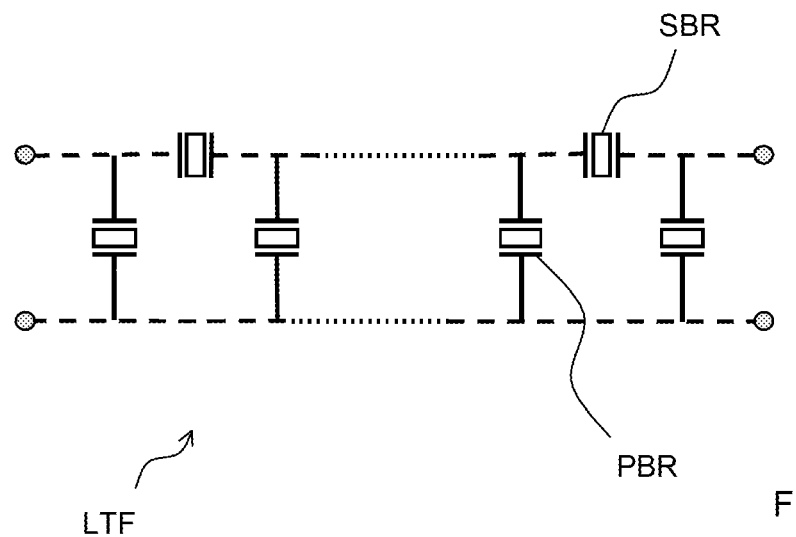
FIG. 3 shows a ladder-type filter structure LTF with series branch resonators SBR and parallel branch resonators PBR.

FIG. 3 shows a ladder-type filter structure LTF with a series connection of series branch resonators SBR and a plurality of parallel branch resonators PBR in shunt branches that can connect the signal path comprising the series branch resonators with a ground potential.

Figure 4:
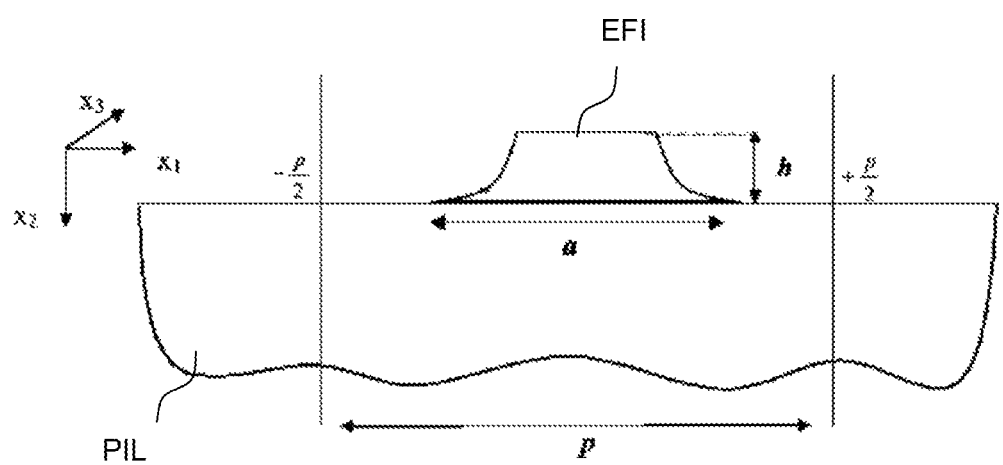
FIG. 4 shows a cross-section through an electrode finger EF on a piezoelectric substrate/layer.

FIG. 4 shows a cross-section through an electroacoustic component. The section's plane is perpendicular to an electrode finger EF. The electrode finger EF is arranged on the piezoelectric layer PIL. The electrode finger EF has a height h and a width a. The transducer has a pitch p which is defined as the mean distance between center points of adjacent electrode fingers EF or between adjacent excitation centers which are arranged between adjacent electrode fingers. The direction of propagation of acoustic waves is parallel to the surface of the piezoelectric layer PIL and orthogonal to the extension of the electrode fingers EF, i.e. the direction of propagation of acoustic waves is along the x1 direction. The electrode fingers EF extend in the x3 direction.

Figure 5:
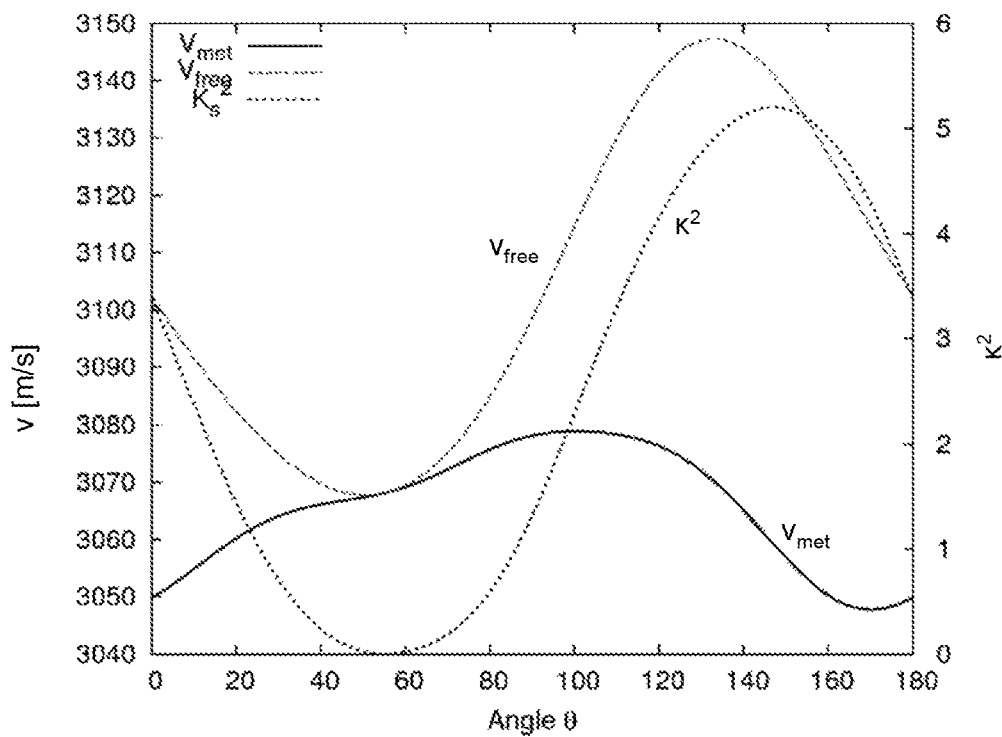
FIG. 5 shows angle-dependent velocities and a coupling coefficient for one embodiment of the electroacoustic component.

FIG. 5 shows phase velocities $v_{free}$, $v_{met}$ and the coupling coefficient $\kappa^2$ of a Lamb mode for an electroacoustic component with a 1 μm thick lithium niobate layer and a 1 μm thick $SiO_2$ layer as a passivation layer on the piezoelectric layer. The operating frequency is set to 1 GHz. The velocities and the coupling coefficient depend on the cut angle θ. The cut angle θ defines the rotation around the crystal X-axis. Concerning the crystal orientations one must consider first the crystal axes to define the cut angle. The plate axes then do correspond to rotated crystal axes which usually, cp. the the Std-176 standard, are noted with a prime for one rotation, two primes for two rotations etc. In the present case, i.e. a singly-rotated plate, the crystal axis X corresponds to the x1 axis (the axis around which the rotation is achieved), whereas the rotated Y axis (written Y') coincides with x2 and hence Z' and x3 are colinear.

$v_{free}$ denotes the phase velocity for a free, i.e. not metalized, piezoelectric surface. $v_{met}$ denotes the velocity for a metalized piezoelectric surface, i.e. a piezoelectric layer supporting an homogeneous metal layer without mass loading effect, i.e. the layer is assumed infinitely thin, but the boundary conditions are those of an homogeneous surface electrical potential forced to zero without any loss of generality.

Figure 6:
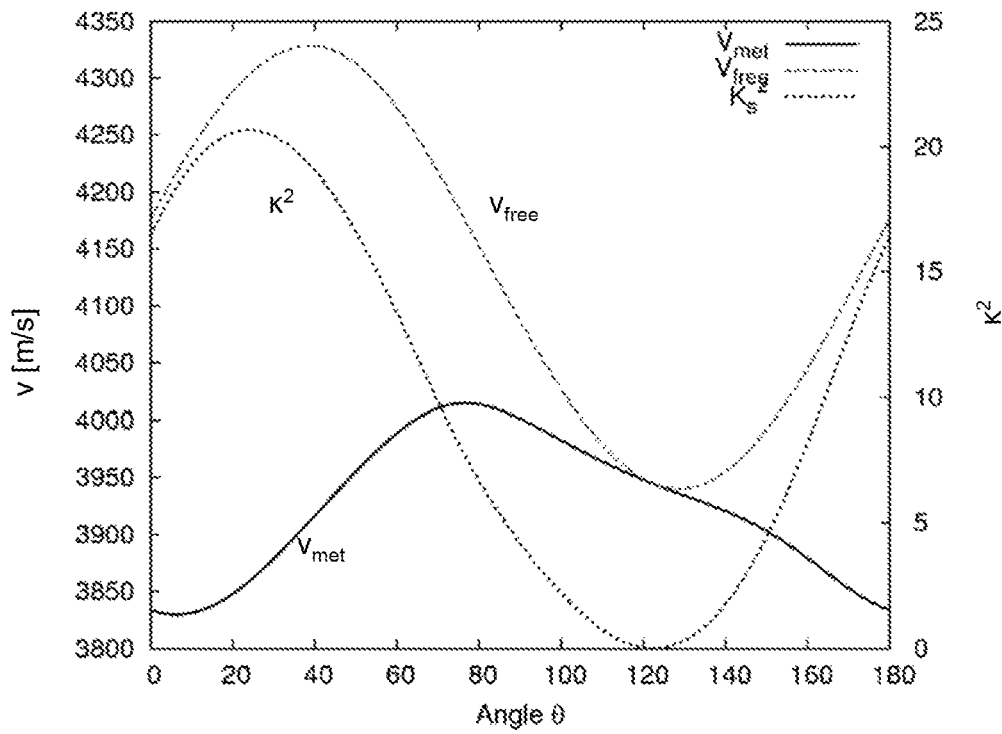
FIG. 6 shows angle-dependent velocities and a coupling coefficient for one embodiment of the electroacoustic component.

FIG. 6 shows phase velocities for a free surface $v_{free}$ and for a metalized surface $v_{met}$ and the coupling coefficient $\kappa^2$ versus the cut angle θ for the layer stack as referred to in FIG. 5 but with respect to a shear mode.

Figure 7:
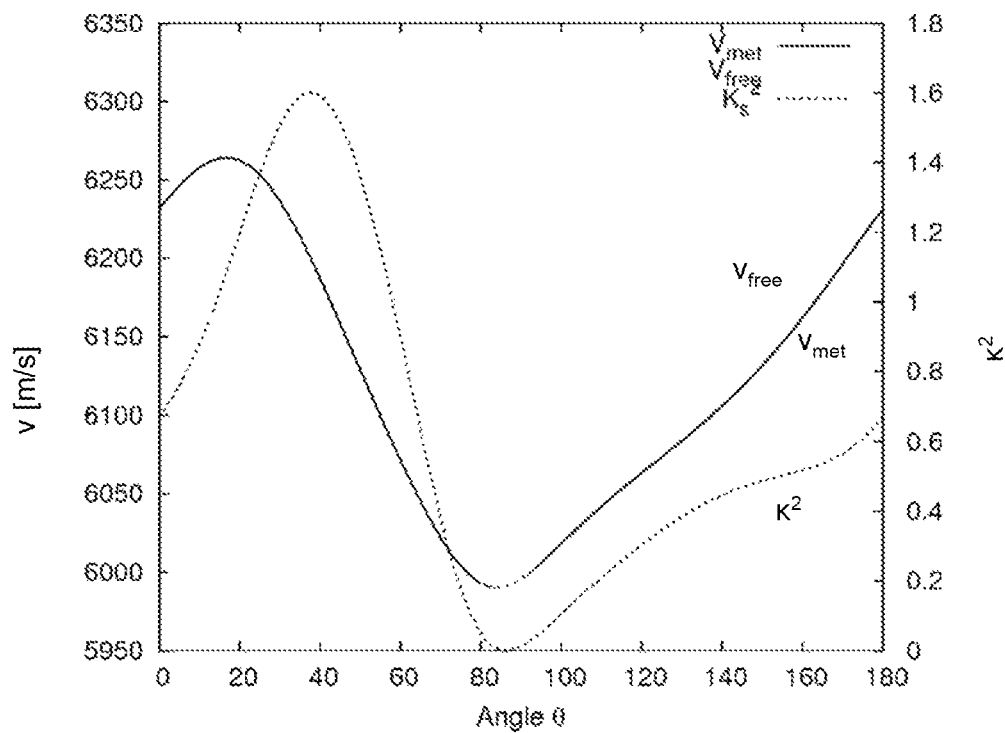
FIG. 7 shows angle-dependent velocities and a coupling coefficient for one embodiment of the electroacoustic component.

FIG. 7 shows the phase velocity $v_{free}$ for a free surface, the phase velocity $v_{met}$ for a metalized surface and the coupling coefficient $\kappa^2$ for the layer stacks referred to in FIGS. 5 and 6 versus cut angle θ. However, FIG. 7 shows the velocities and the coupling coefficient for a longitudinal mode.

In the angular range of 50° to 60°, the Lamb mode is suppressed and the shear mode exhibits an electro-mechanical coupling coefficient larger than 15%. Near θ=120°, the shear mode is suppressed and the Lamb mode exceeds 4%. Thus, the angular range from 50° to 60° can be utilized with a shear mode, and the angular range around 120° can be used with a Lamb mode. In both angular ranges, the respective longitudinal mode is relatively weak.

Especially an angle of θ=55° can be favored for a shear-mode electroacoustic component.

Figure 8:
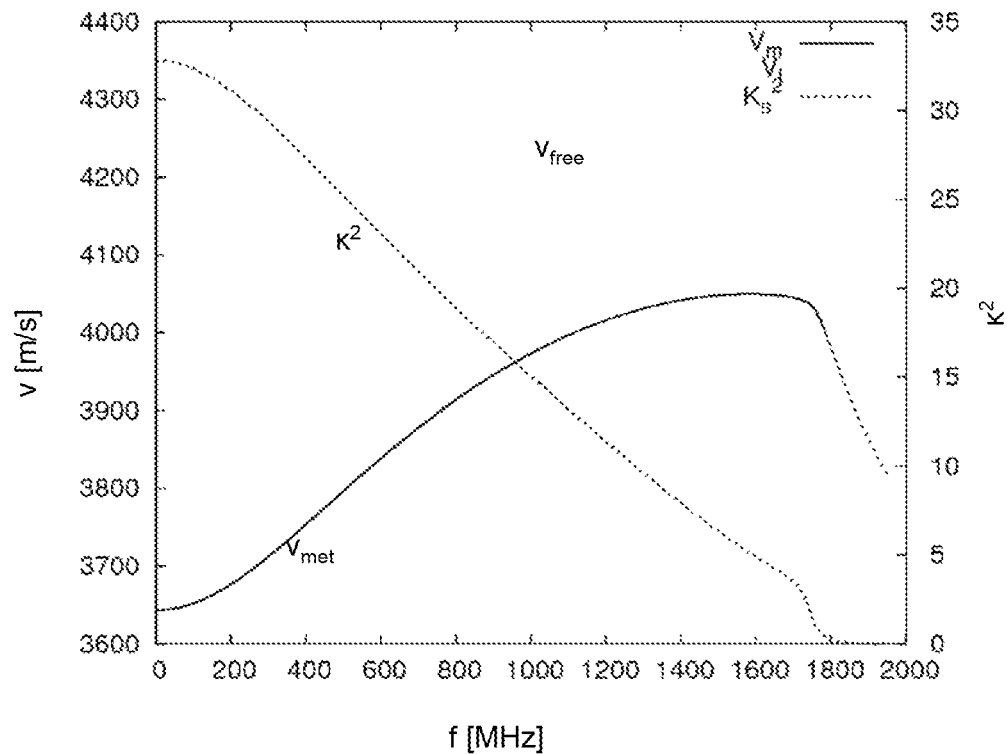
FIG. 8 shows frequency-dependent velocities and a coupling coefficient for an embodiment of the electroacoustic component.

FIG. 8 shows the frequency dependence of the phase velocity for a free surface $v_{free}$, of the phase velocity for a metalized surface $v_{met}$ and the frequency-dependent coupling coefficient $\kappa^2$ for a cut angle θ=5°. The piezoelectric layer comprises lithium niobate and has a thickness of 0.25 μm. The passivation layer comprises silica and has a thickness of 0.25 μm.

Figure 9:
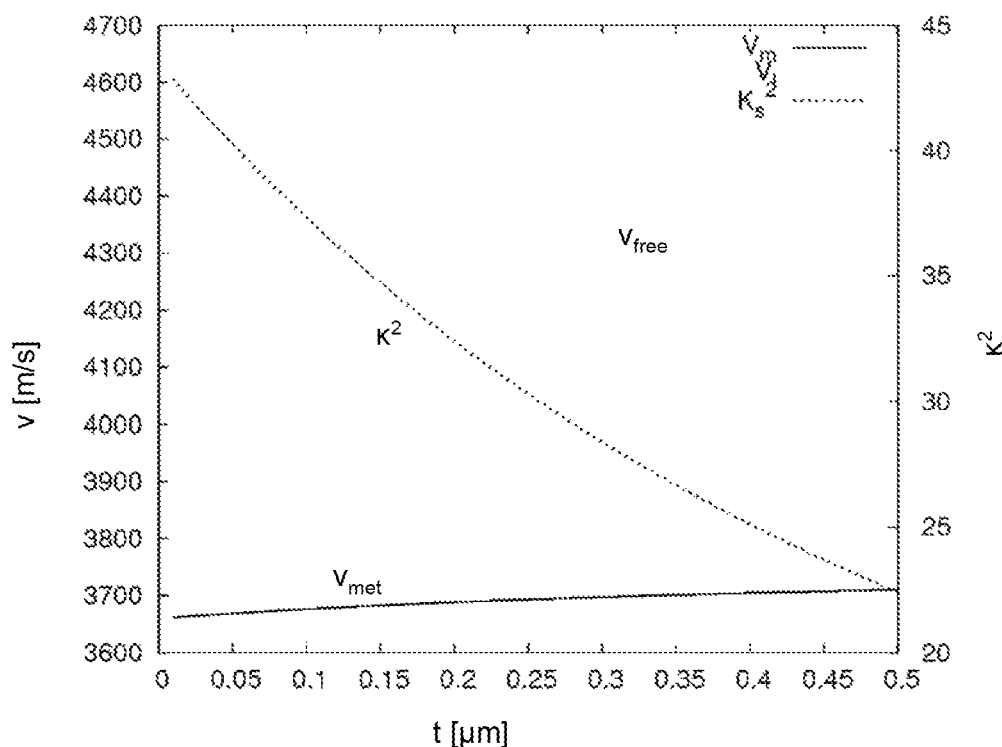
FIG. 9 shows velocities and a coupling coefficient vs. the thickness of the passivation layer for an embodiment of the electroacoustic component.

FIG. 9 shows the phase velocity $v_{free}$ for a free piezoelectric surface, the phase velocity $v_{met}$ for a metalized piezoelectric surface and the coupling coefficient $\kappa^2$ vs. the thickness t of the passivation layer. The piezoelectric substrate comprises $LiNbO_3$ and has a thickness of 500 nm.

Figure 10:
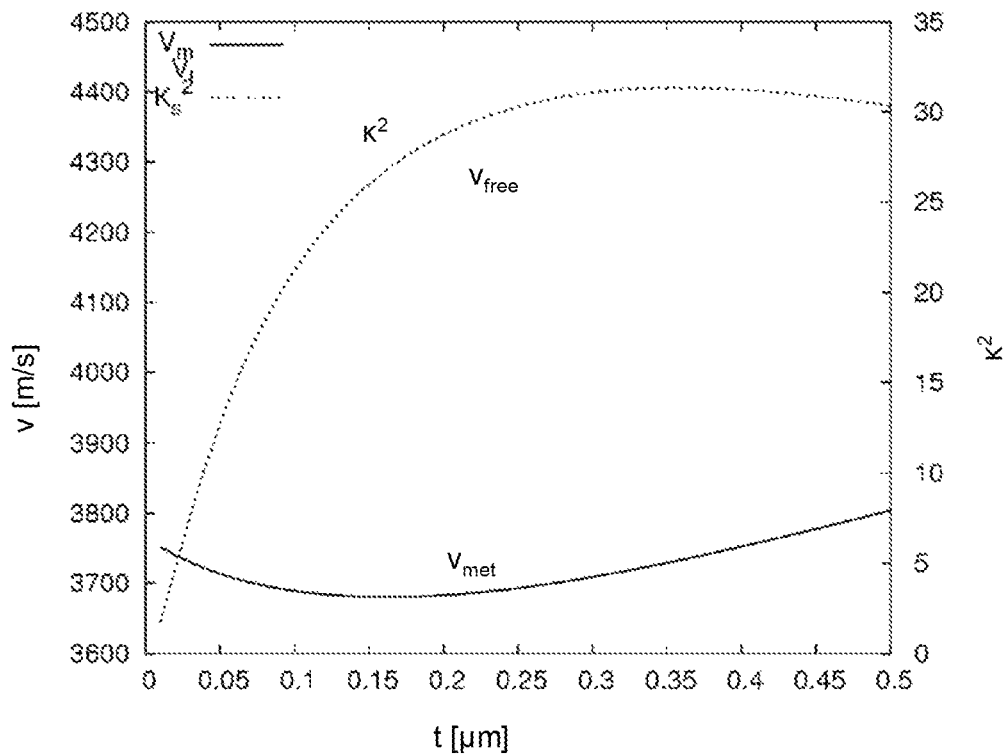
FIG. 10 shows velocities and a coupling coefficient vs. the thickness of the piezoelectric layer.

FIG. 10 shows the phase velocity $v_{free}$ for a free piezoelectric surface, the phase velocity $v_{met}$ for a metalized piezoelectric surface and the coupling coefficient $\kappa^2$ vs. the thickness t of the piezoelectric layer. The piezoelectric substrate comprises $LiNbO_3$. The passivation layer comprises $SiO_2$ and has a thickness of 500 nm.

A high coupling coefficient $\kappa^2$ can be obtained for thin passivation layers. However, a finite passivation layer thickness is needed for reducing the TCF. With a 200 nm thick $LiNbO_3$ layer and a 400 nm thick $SiO_2$ layer, a TCF of −2,8 ppm/K can be obtained for $v_{met}$ and for a resonance frequency, and a TCF of 1.13 ppm/K can be obtained for $v_{free}$ for an anti-resonance frequency (compare FIGS. 20-23).

Figure 11:
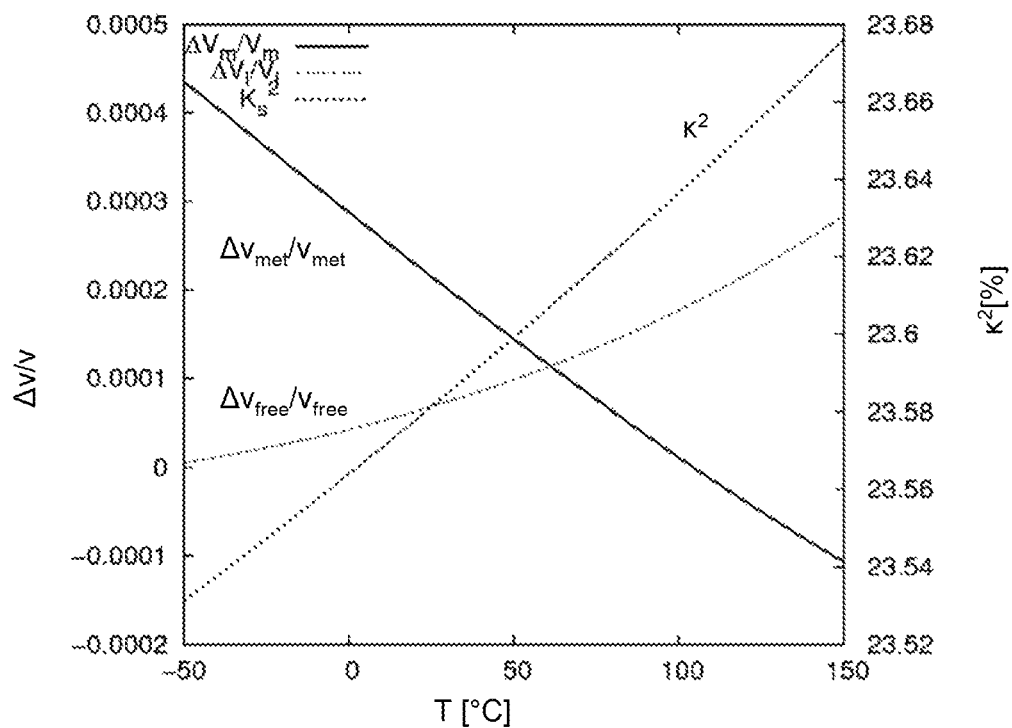
FIG. 11 shows relative velocity variations and a coupling coefficient vs. temperature.

FIG. 11 shows the temperature sensitivity of velocity variations $\Delta v_{met}/v_{met}$, $\Delta V_{free}/V_{free}$, and the coupling coefficient $\kappa^2$ in the temperature range from −50° C. to 150° C. for a shear mode. The piezoelectric layer comprises $LiNbO_3$ and has a thickness of 350 nm, and the passivation layer comprises $SiO_2$ and has a thickness of 550 nm.

Figure 12:
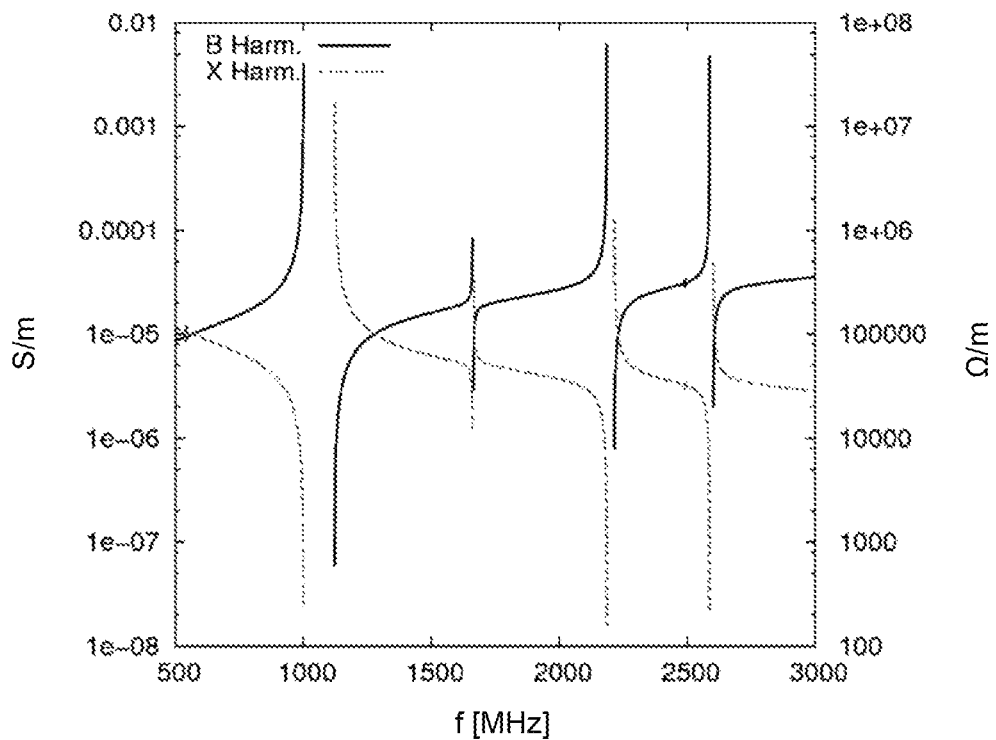
FIG. 12 shows the susceptance and the reactance vs. frequency for an embodiment of the electroacoustic component.

FIG. 12 shows the harmonic admittance of a periodic Al-grating atop a $LiNbO_3$ $_{(YX}1)/55°$ piezoelectric layer on a $SiO_2$ passivation layer. The pitch p is 1.85 μm, the metallization ratio η=a/p is 0.5. The relative height of the electrode h/λ, is 1% with a height h of 75 nm. The $LiNbO_3$ has a thickness of 350 nm, and the $SiO_2$ is 550 nm thick.

Figure 13:
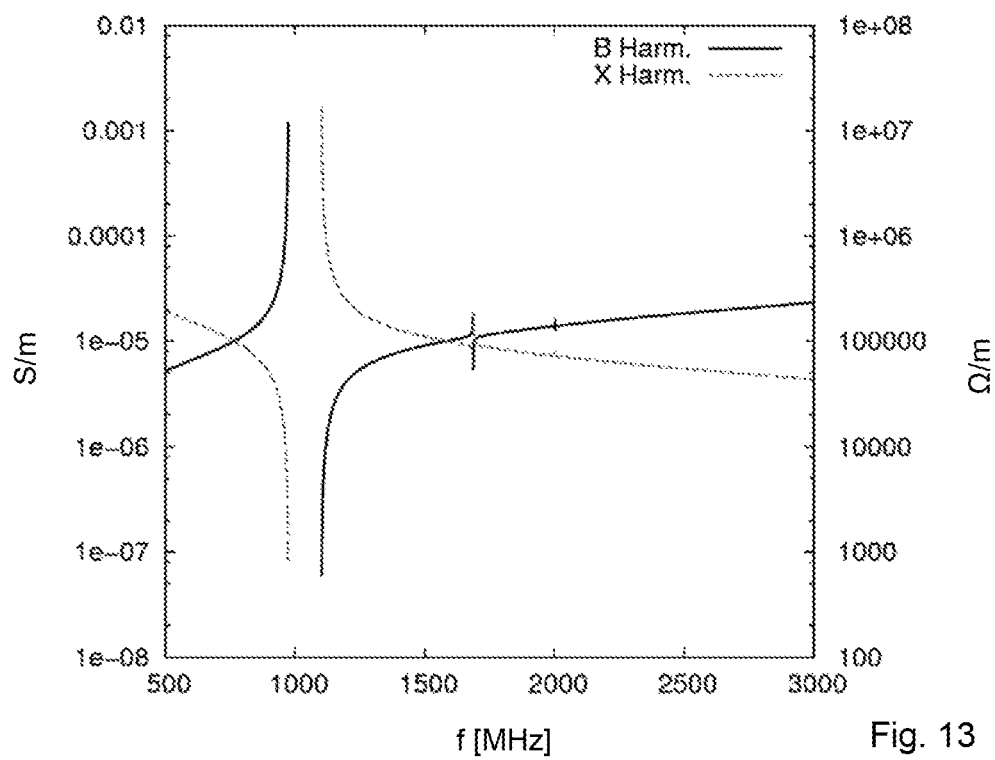
FIG. 13 shows the susceptance and the reactance vs. frequency for an embodiment of the electroacoustic component.

FIG. 13 shows the harmonic admittance of a periodic Al-grating atop a $LiNbO_3$ (YX1)/55° piezoelectric layer on a $SiO_2$ passivation layer. The pitch p is 1.85 μm, the metallization ratio η=a/p is 0.5. The relative height of the electrode h/λ, is 1% with a height h of 75 nm. The $LiNbO_3$ has a thickness of 175 nm, and the $SiO_2$ is 275 nm thick.

A systematic computation yields: For 0.4<a/p<0.45, coupling factors in excess of 23% are obtained with a reflection coefficient on a single obstacle, e.g. a single aluminum electrode, approaching 25%. The obstacle can have a relative height h/λ near 5%, e.g. h=350 nm.

Figure 14:
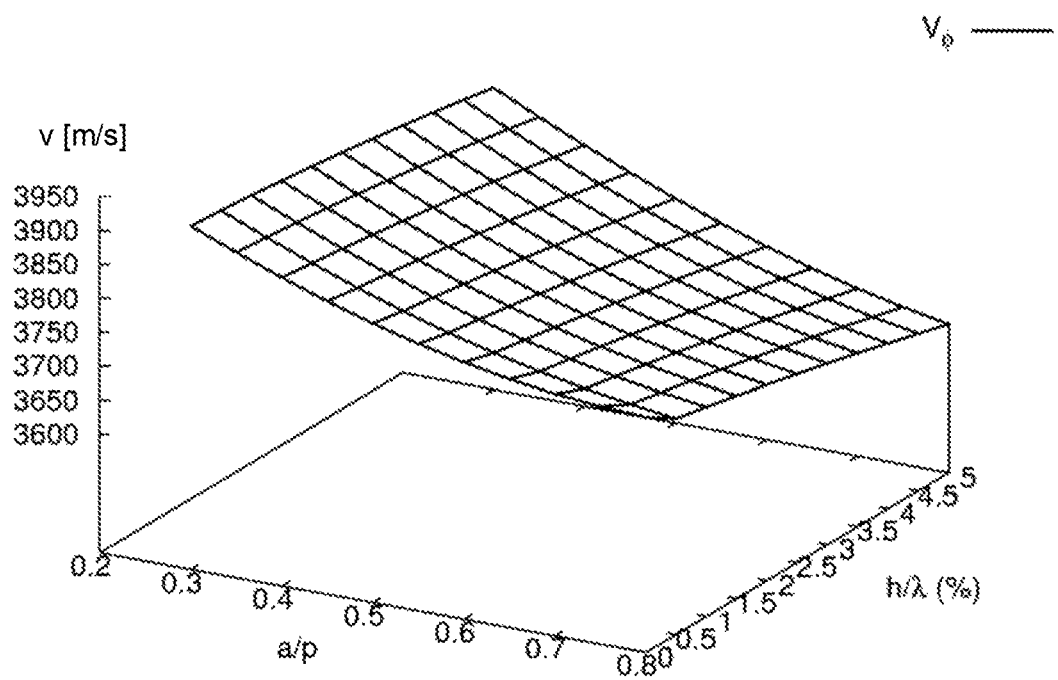
FIG. 14 shows the velocity vs. metallization ratio and vs. relative electrode height for an embodiment of the electroacoustic component.

FIG. 14 shows the phase velocity v vs. the metallization ratio a/p and vs. the relative electrode height h/λ for an electroacoustic component.

Figure 15:
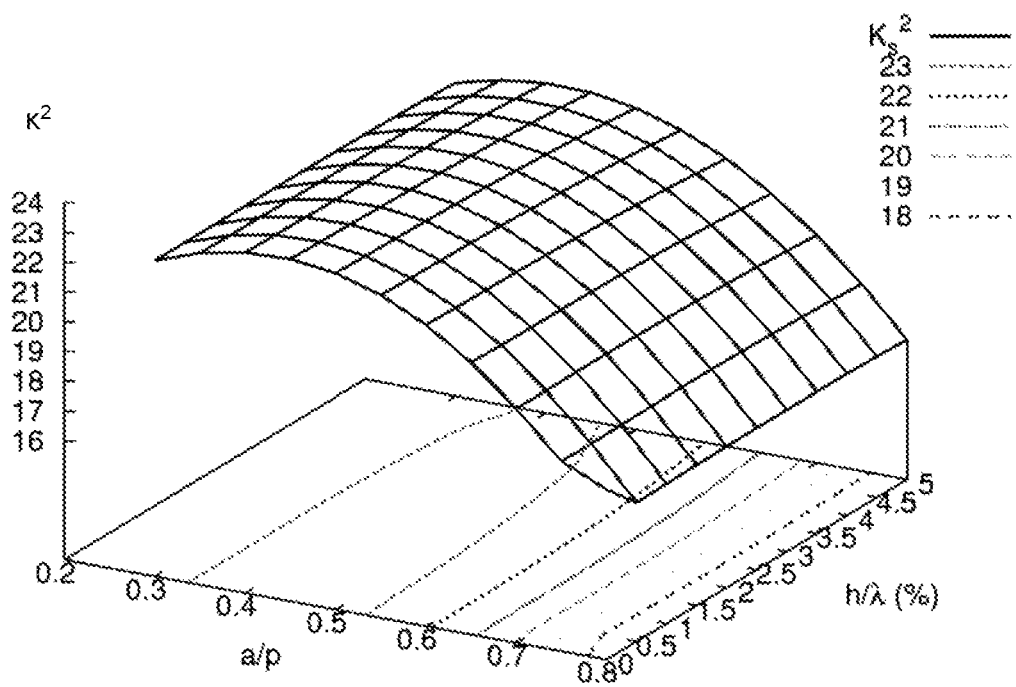
FIG. 15 shows the coupling coefficient vs. the metallization ratio and vs. the relative electrode height for an embodiment of the electroacoustic component.

FIG. 15 shows the coupling coefficient $\kappa^2$ vs. the metallization ratio a/p and vs. the relative electrode height h/λ for the component of FIG. 14.

Figure 16:
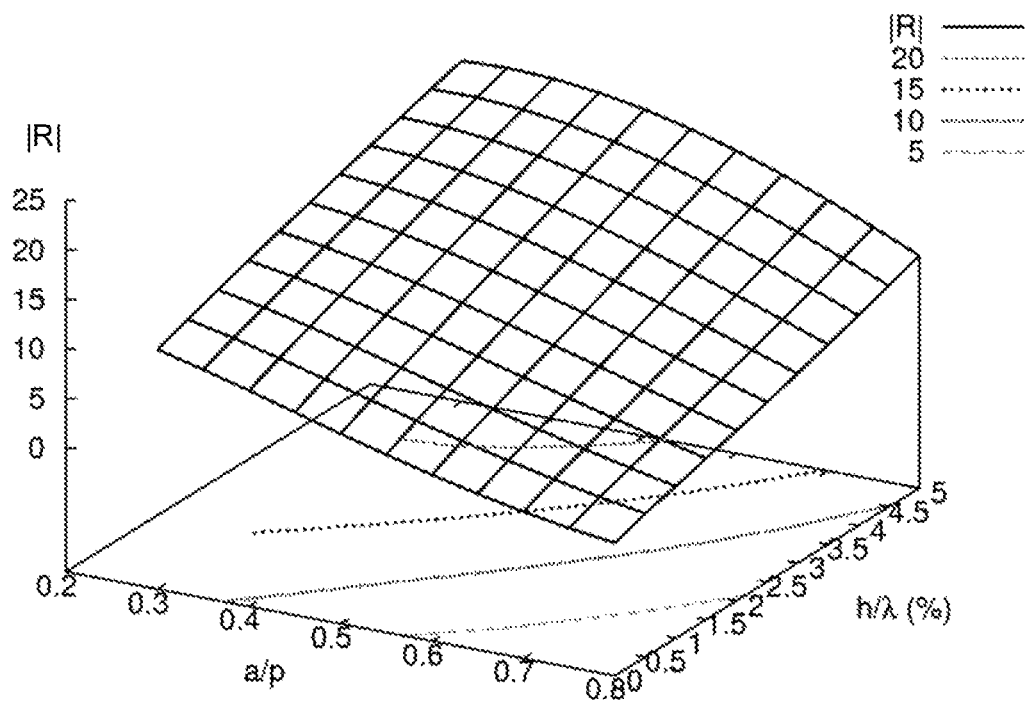
FIG. 16 shows the reflection coefficient modulus vs. the metallization ratio and the relative electrode height for an embodiment of the electroacoustic component.

FIG. 16 shows the reflection coefficient modulus |R| vs. the metallization ratio a/p and vs. the relative electrode height h/λ for the component of FIG. 14.

Figure 17:
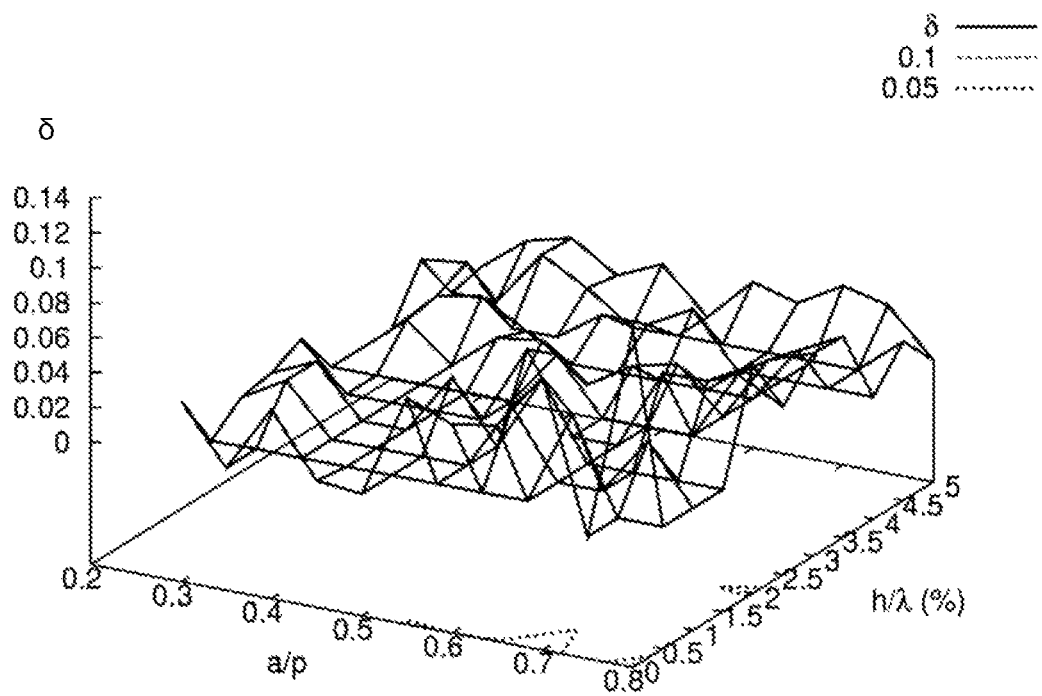
FIG. 17 shows the directivity vs. the metallization ratio and vs. the relative electrode height for an embodiment of the electroacoustic component.

FIG. 17 shows the directivity δ vs. the metallization ratio a/p and vs. the relative electrode height h/λ for the component of FIG. 14.

FIGS. 14 to 17 show mixed matrix parameters for an electroacoustic component with a piezoelectric layer comprising $LiNbO_3$ with a cut angle Θ of 55° and a thickness of 350 nm. The piezoelectric layer is arranged on a 550 nm thick $SiO_2$ layer. The electrode structure comprises Al (Aluminium) and has a pitch p of 1.85 μm.

Figure 18:
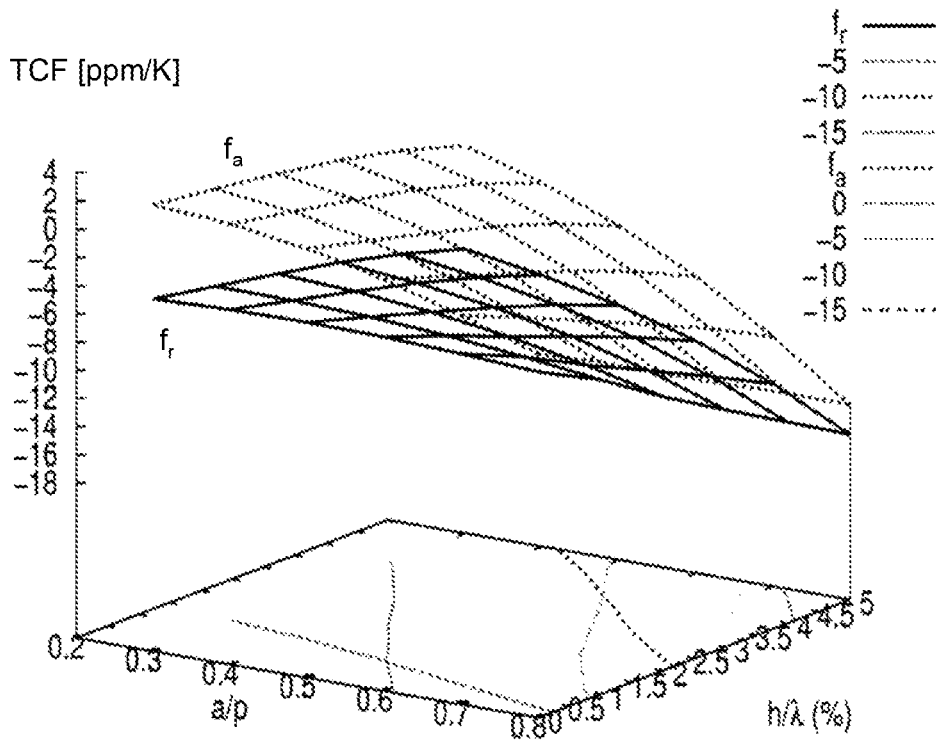
FIG. 18 shows the temperature coefficient of frequencies for the resonance and the anti-resonance mode vs. metallization ratio and relative electrode height for an embodiment of the electroacoustic component.

FIG. 18 shows the TCF vs. metallization ratio a/p and vs. the relative electrode height h/λ for the resonance frequency $f_r$ and for the anti-resonance frequency $f_a$. It was found that the use of Al can reduce the TCF by approximately 1 ppm/K per percent of the relative electrode height. A minimum difference of the TCF between $f_r$ and $f_a$ can be obtained at approx. a/p=0.8.

Figure 19:
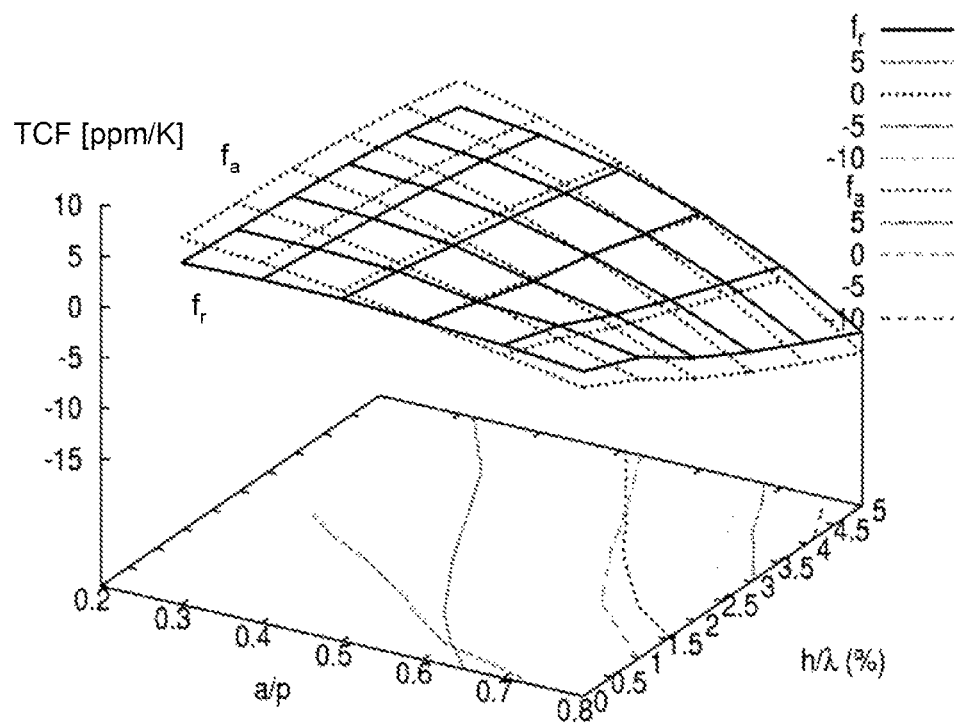
FIG. 19 shows the temperature coefficient of frequencies for resonance and anti-resonance modes vs. the metallization ratio and the relative electrode height for an embodiment of the electroacoustic component.

FIG. 19 shows the TCF vs. metallization ratio a/p and vs. the relative electrode height ha, for the resonance frequency $f_r$ and for the anti-resonance frequency $f_a$. The component referred to in FIG. 19 has a 200 nm thick (YX1)/52° LiNbO$_3$ layer on a 400 nm thick SiO$_2$ layer. At a metallization ratio a/p of approx. 0.6, the difference in TCF for $f_r$ and $f_a$ mainly vanishes and small absolute TCF values are obtained for different normalized heights h.

Figure 20:
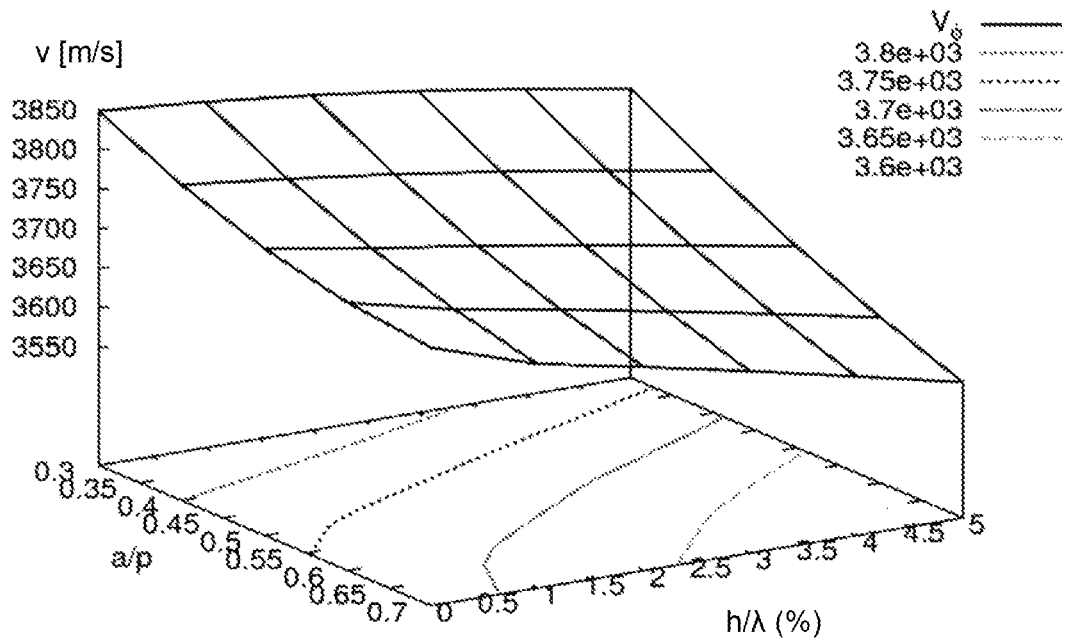
FIG. 20 shows the velocity vs. the metallization ratio and vs. the relative electrode height for an embodiment of the electroacoustic component.

FIG. 20 shows the phase velocity v vs. the metallization ratio a/p and vs. the relative electrode height h/λ for an electroacoustic component.

Figure 21:
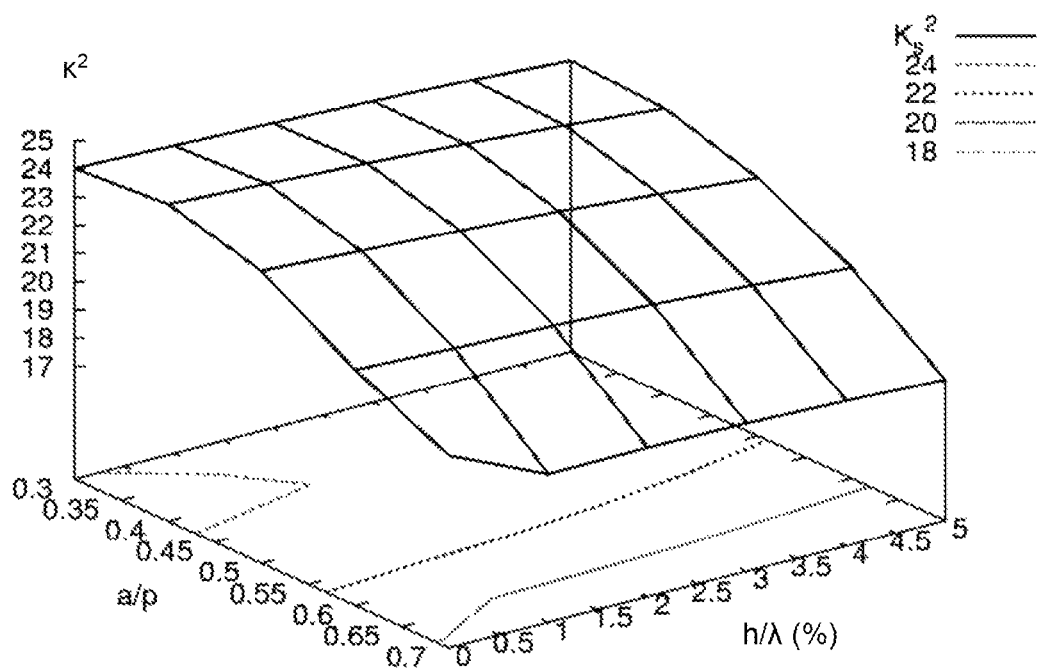
FIG. 21 shows the coupling coefficient vs. the metallization ratio and vs. the relative electrode height for an embodiment of the electroacoustic component.

FIG. 21 shows the coupling coefficient κ$^2$ vs. the metallization ratio a/p and vs. the relative electrode height for the component of FIG. 20.

Figure 22:
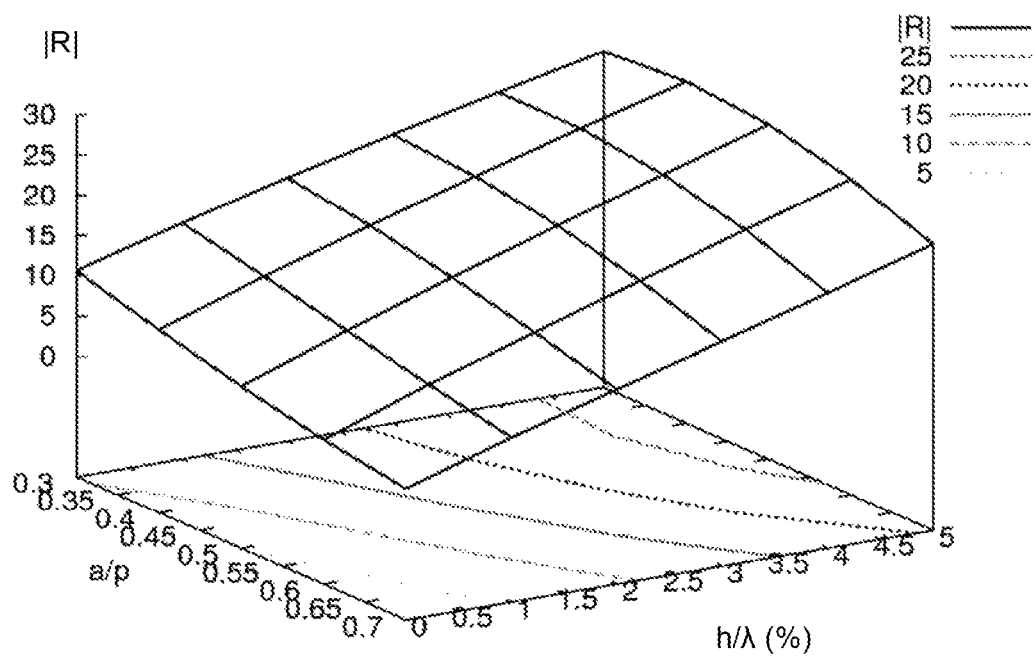
FIG. 22 shows the reflection coefficient vs. the metallization ratio and vs. the relative electrode height for an embodiment of the electroacoustic component.

FIG. 22 shows the reflection coefficient modulus |R| vs. the metallization ratio a/p and vs. the relative electrode height for the component of FIG. 20.

Figure 23:
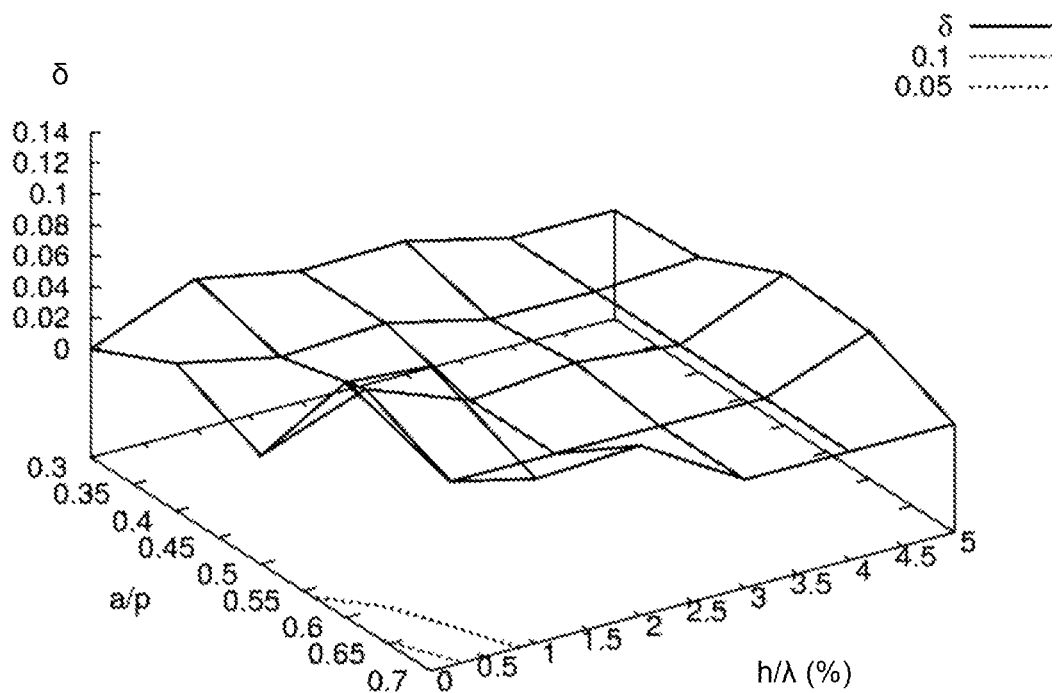
FIG. 23 shows the directivity vs. the metallization ratio and the relative electrode height for an embodiment of the electroacoustic component.

FIG. 23 shows the directivity δ vs. the metallization ratio a/p and vs. the relative electrode height for the component of FIG. 20.

FIGS. 20 to 23 show mixed matrix parameters for an electroacoustic component with a piezoelectric layer comprising LiNbO$_3$ with a cut angle Θ of 52° and a thickness of 200 nm. The piezoelectric layer is arranged on a 400 nm thick SiO$_2$ layer. The electrode structure comprises Al and has a pitch p of 1.85 μm.

Figure 24:
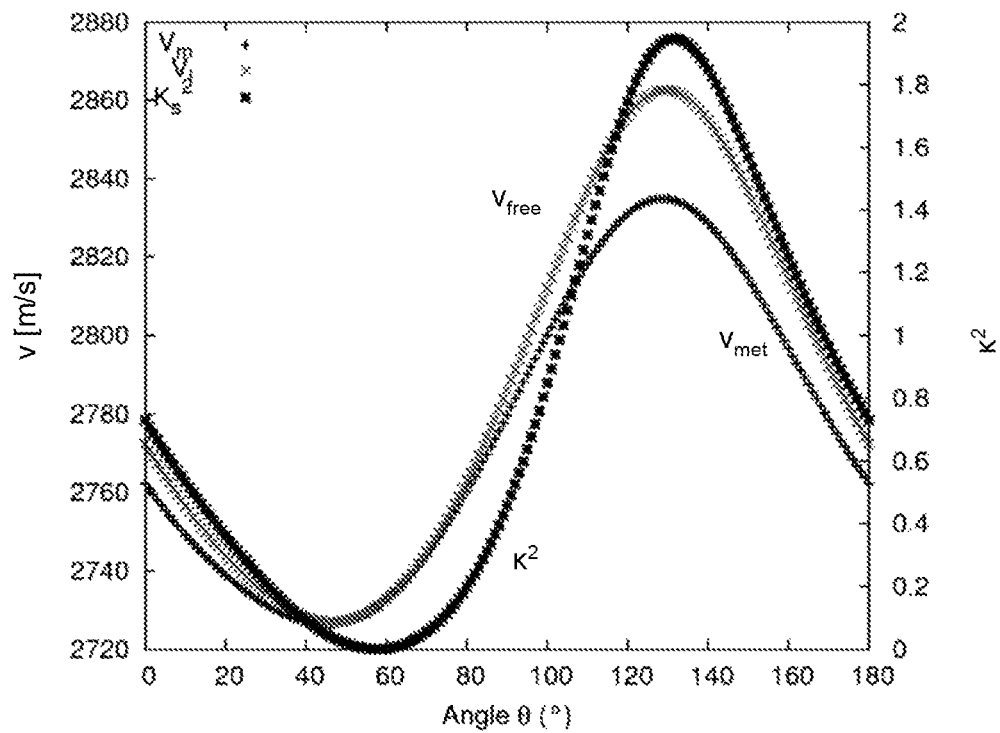
FIG. 24 shows velocities and the coupling coefficient (angle-dependent) of an embodiment of the electroacoustic component.

FIG. 24 shows the phase velocity $v_{free}$ for a free surface, the phase velocity $v_{met}$ for a metalized surface and the electroacoustic coupling coefficient κ$^2$ for a Lamb mode of an electroacoustic component. The component has a 1 μm thick LiTaO$_3$ piezoelectric layer on a 1 μm thick SiO$_2$ layer.

Figure 25:
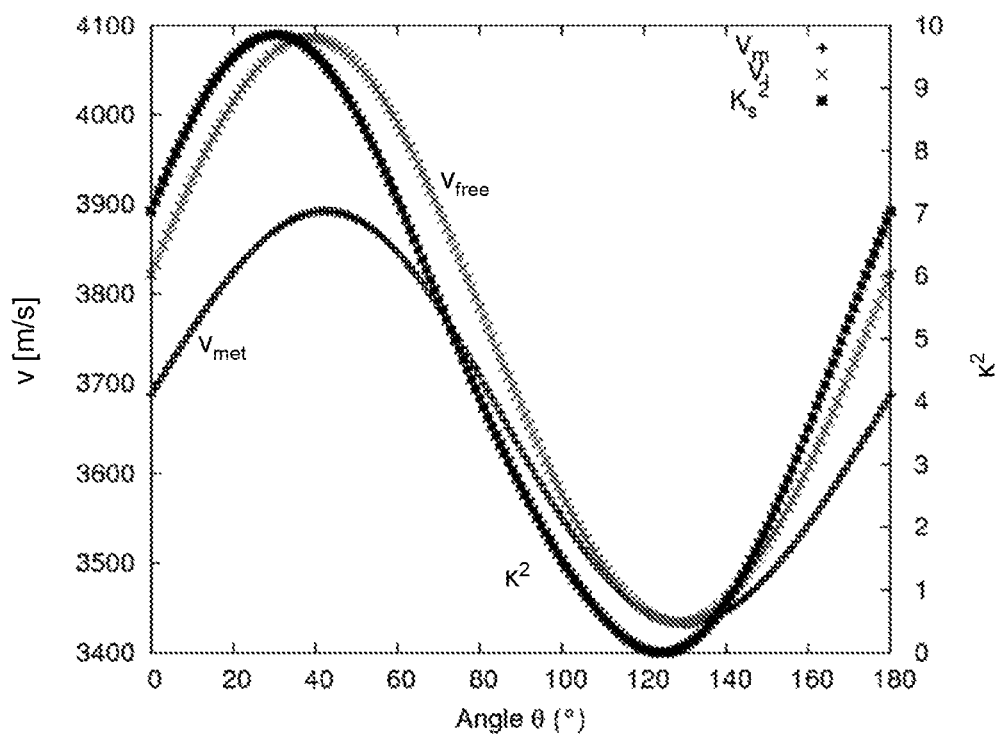
FIG. 25 shows velocities and the coupling coefficient (angle-dependent) for an embodiment of the electroacoustic component.

FIG. 25 shows the phase velocity $v_{free}$ for a free surface, the phase velocity $v_{met}$ for a metalized surface and the electroacoustic coupling coefficient κ$^2$ for a shear mode of an electroacoustic component. The component has a 1 μm thick LiTaO$_3$ piezoelectric layer on a 1 μm thick SiO$_2$ layer.

Figure 26:
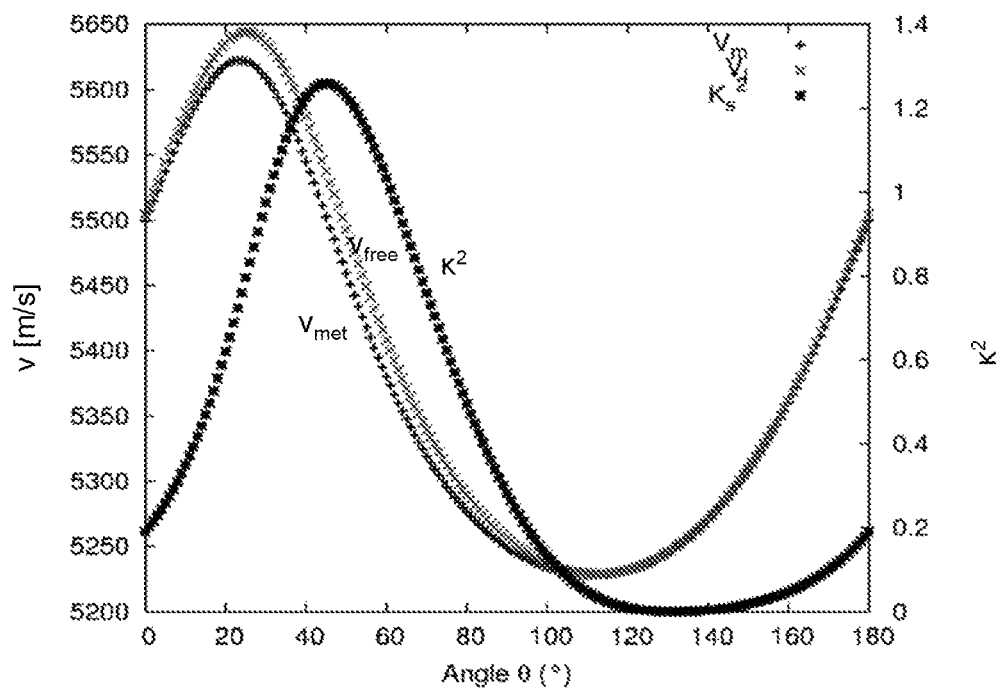
FIG. 26 shows angle-dependent velocities and a coupling coefficient of an embodiment of the electroacoustic component.

FIG. 26 shows the phase velocity $v_{free}$ for a free surface, the phase velocity $v_{met}$ for a metalized surface and the electroacoustic coupling coefficient κ$^2$ for a longitudinal mode of an electroacoustic component. The component has a 1 μm thick LiTaO$_3$ piezoelectric layer on a 1 μm thick SiO$_2$ layer.

Figure 27:
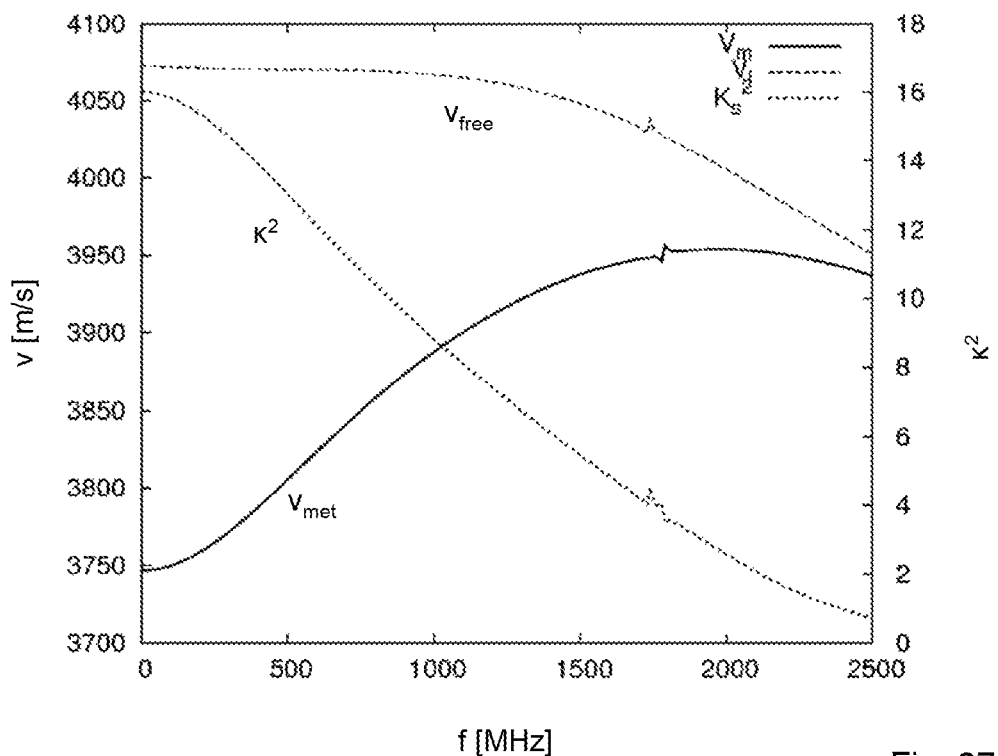
FIG. 27 shows velocities and the coupling coefficient (frequency-dependent) of an embodiment of the electroacoustic component.

FIG. 27 shows the shear mode dispersion of an electroacoustic component with a 1 μm thick (YX1)/55° LiNbO$_3$ layer above a 1 μm thick SiO$_2$ comprising passivation layer. $v_{free}$ denotes the phase velocity of a free surface, $v_{met}$ denotes the phase velocity of a metalized surface, and κ$^2$ denotes the coupling coefficient.

Figure 28:
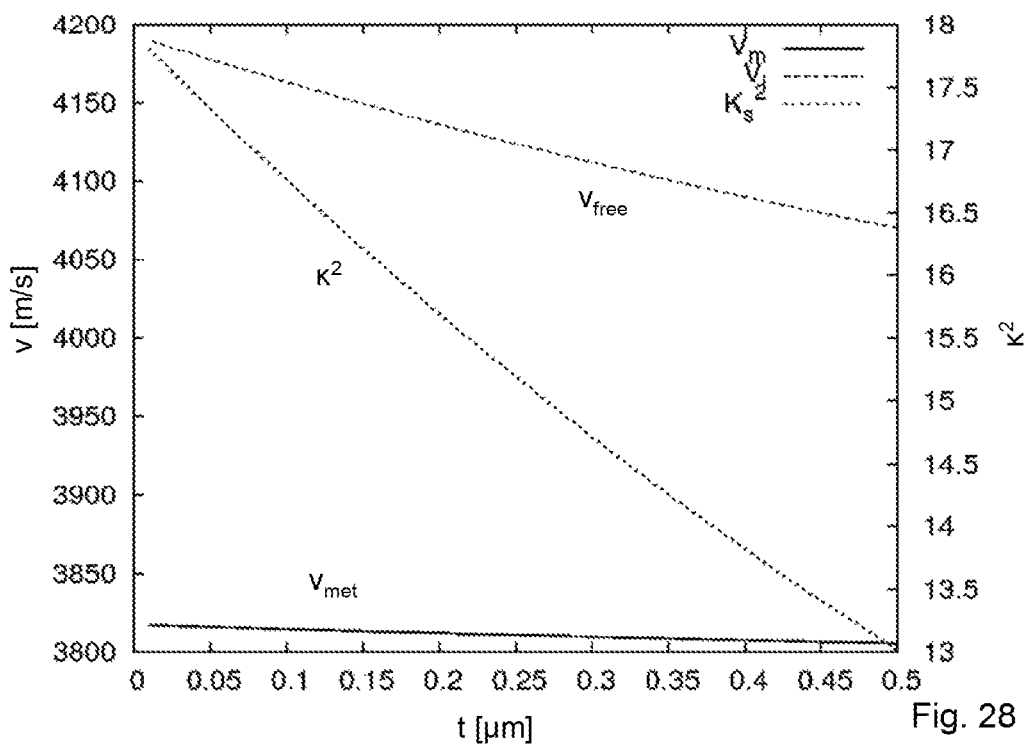
FIG. 28 shows velocities and the coupling coefficient vs. the thickness of the passivation layer.

FIG. 28 shows the phase velocity $v_{free}$ of a free surface, the phase velocity $v_{met}$ of a metalized surface and the coupling coefficient κ$^2$ vs. the thickness of a passivation layer comprising SiO$_2$. The component has a 500 nm thick LiNbO$_3$ piezoelectric layer.

Figure 29:
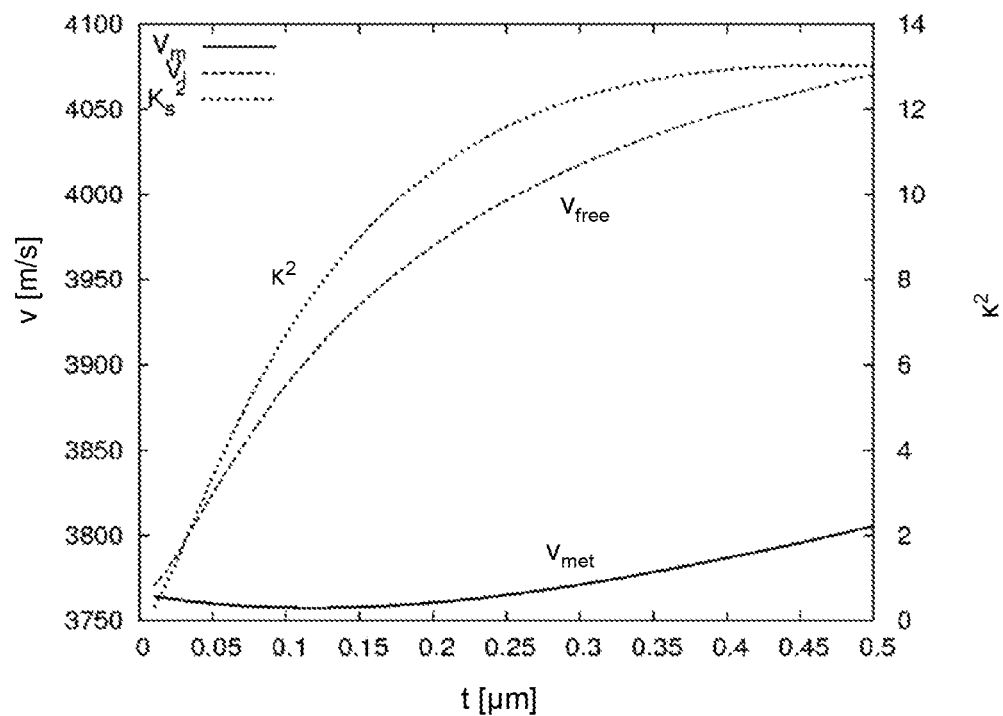
FIG. 29 shows velocities and the coupling coefficient vs. the thickness of the piezoelectric layer for an embodiment of the electroacoustic component.

FIG. 29 shows the phase velocity $v_{free}$ of a free surface, the phase velocity $v_{met}$ of a metalized surface and the coupling coefficient κ$^2$ vs. the thickness of a piezoelectric layer comprising LiNbO$_3$. The component has a 500 nm thick SiO$_2$ passivation layer.

Figure 30:
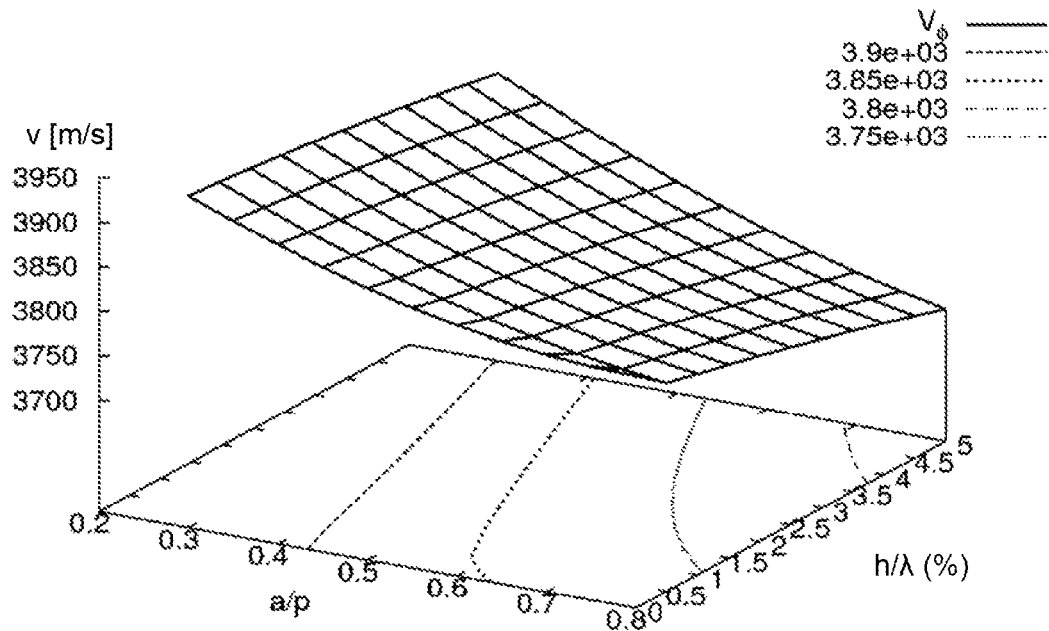
FIG. 30 shows the velocity vs. the metallization ratio and vs. the relative electrode height for an embodiment of the electroacoustic component.

FIG. 30 shows the phase velocity v vs. the metallization ratio a/p and vs. the relative electrode height h/λ for an electroacoustic component.

Figure 31:
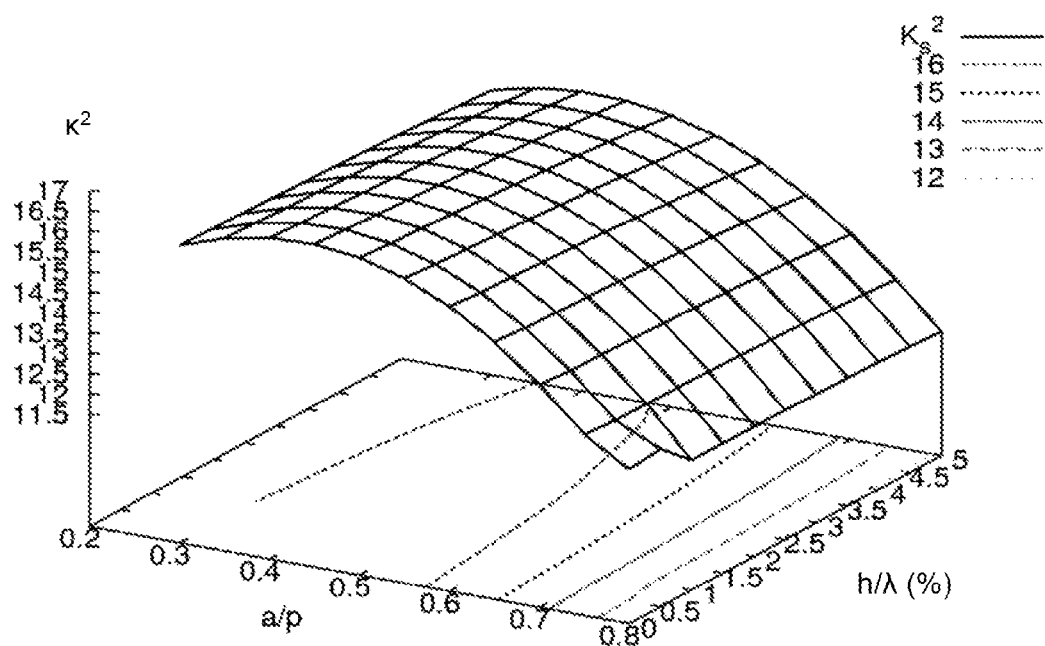
FIG. 31 shows the coupling coefficient vs. the metallization ratio and vs. the relative electrode height for an embodiment of the electroacoustic component.

FIG. 31 shows the coupling coefficient κ$^2$ vs. the metallization ratio a/p and vs. the relative electrode height for the component of FIG. 30.

Figure 32:
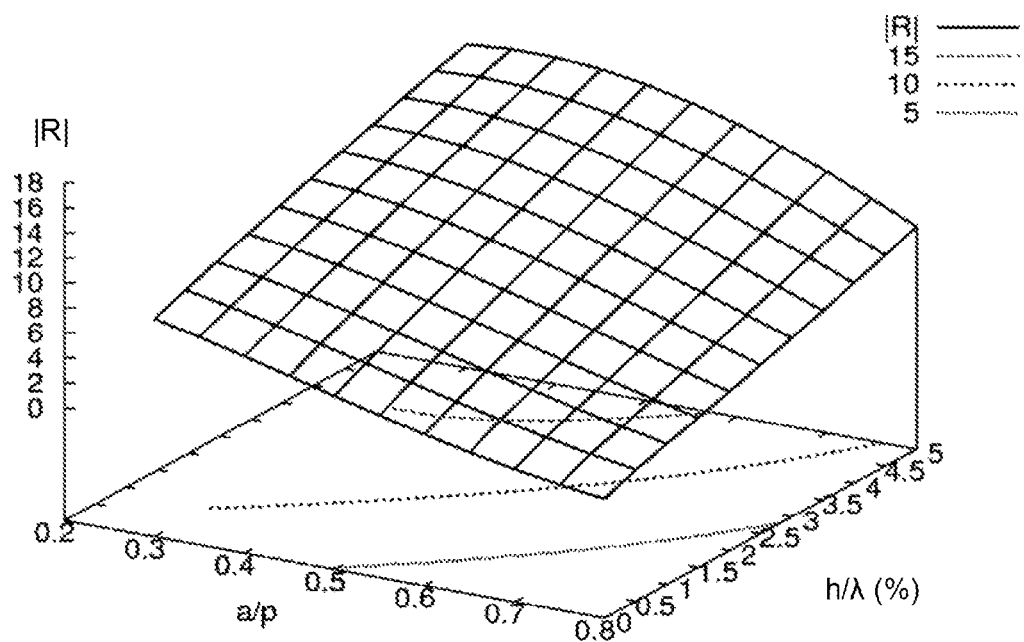
FIG. 32 shows the reflection coefficient vs. the metallization ratio and vs. the relative electrode height for an embodiment of the electroacoustic component.

FIG. 32 shows the reflection coefficient modulus |R| vs. the metallization ratio a/p and vs. the relative electrode height for the component of FIG. 30.

Figure 33:
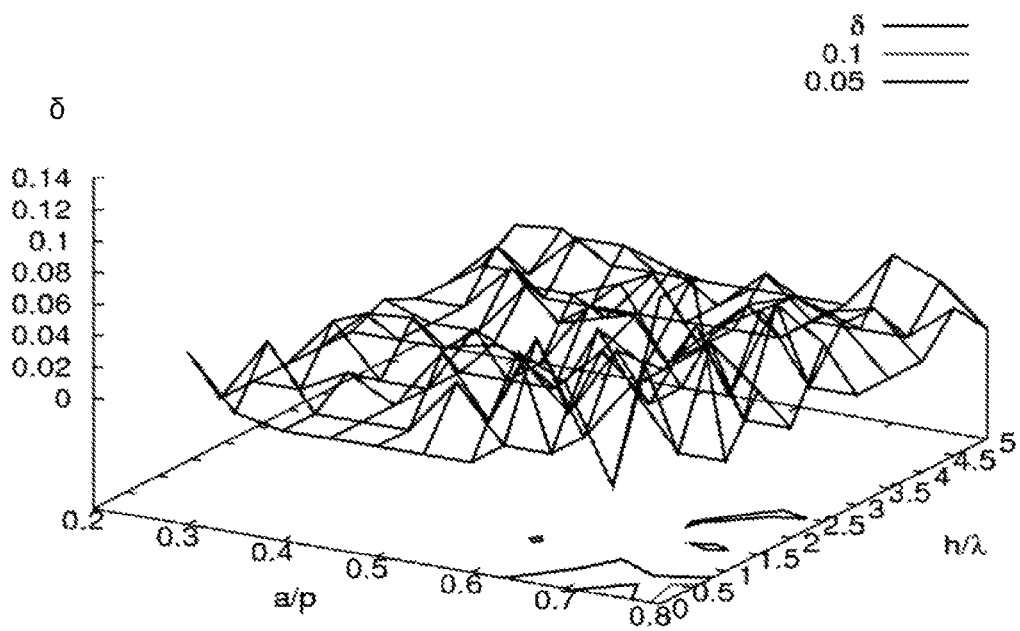
FIG. 33 shows the directivity vs. the metallization ratio and vs. the relative electrode height for an embodiment of the piezoelectric component.

FIG. 33 shows the directivity δ vs. the metallization ratio a/p and vs. the relative electrode height for the component of FIG. 30. This parameter reveals close to zero and therefore a resonance at the beginning of the frequency stop-band is expected with any sensitivity to the metallization parameters.

FIGS. 30 to 33 show mixed matrix parameters for an electroacoustic component with a piezoelectric layer comprising LiNbO$_3$ with a cut angle Θ of 48° and a thickness of 465 nm. The piezoelectric layer is arranged on a 100 nm thick SiO$_2$ layer. The electrode structure comprises Al and has a pitch p of 1.9 μm.

Figure 34:
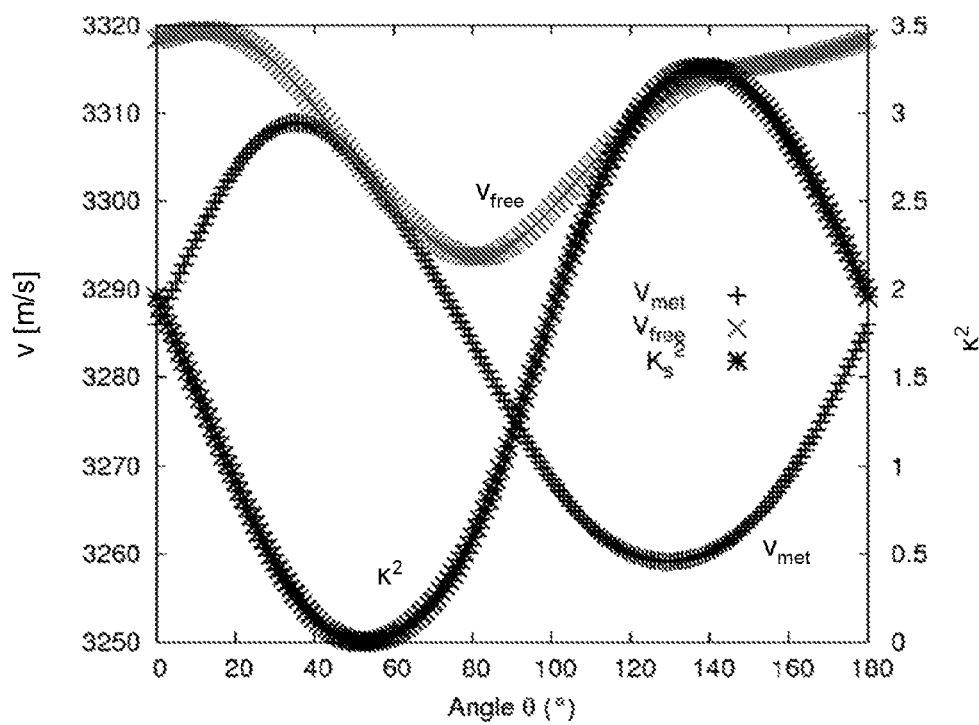
FIG. 34 shows angle-dependent velocities and the coupling coefficient for an embodiment of the electroacoustic component.

FIG. 34 shows the phase velocity $v_{free}$ for a free surface, the phase velocity $v_{met}$ for a metalized surface and the electroacoustic coupling coefficient κ$^2$ for a longitudinal mode of an electroacoustic component. The component has a 1.1 μm thick LiNbO$_3$ piezoelectric layer on a 3 μm thick SiO$_2$ substrate as a passivation layer. A thickness of 3 μm is large enough to substantially suppress a dislocation of the underside of the SiO$_2$ substrate. Thus, substrates having a thickness equal to or larger than 3 μm can be regarded as semi-infinite substrates for this mode especially. Whether a thickness is large enough to make the substrate quasi semi-infinite depends on the frequency. For instance, for frequencies equal to or higher than 1 GHz, a thickness of 550 nm or even 350 nm can make the substrate appear semi-infinite.

Figure 35:
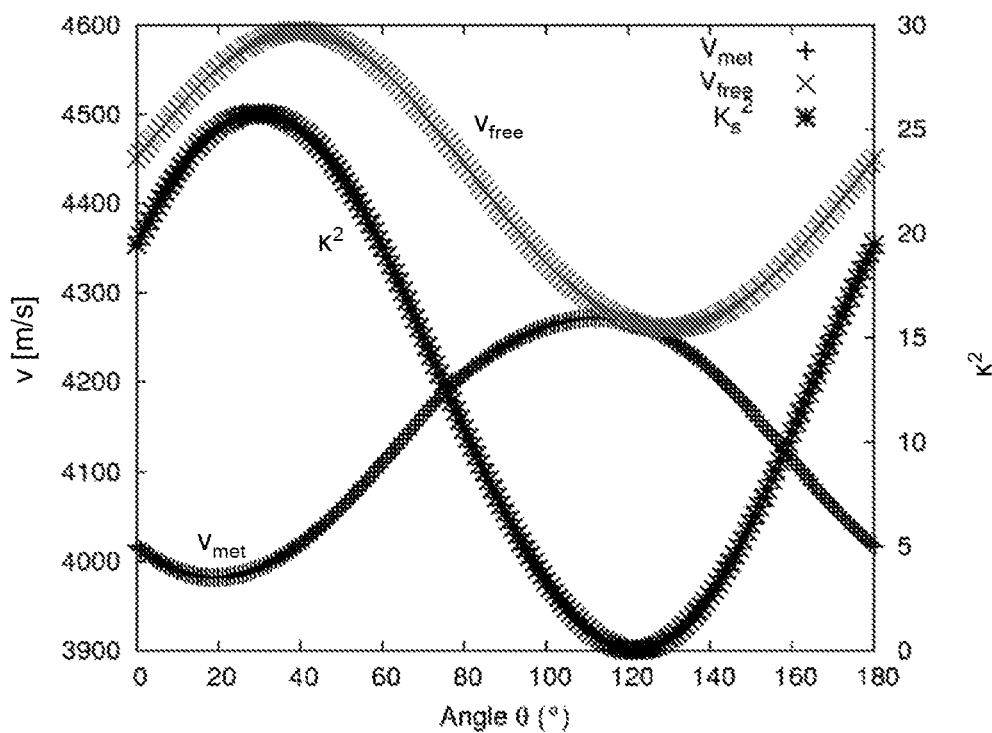
FIG. 35 shows angle-dependent velocities and the coupling coefficient for an embodiment of the electroacoustic component.

FIG. 35 shows the phase velocity $v_{free}$ for a free surface, the phase velocity $v_{met}$ for a metalized surface and the electroacoustic coupling coefficient κ$^2$ for a shear mode of an electroacoustic component. The component has a 1.1 μm thick LiNbO$_3$ piezoelectric layer on a 3 μm thick SiO$_2$ substrate.

Figure 36:
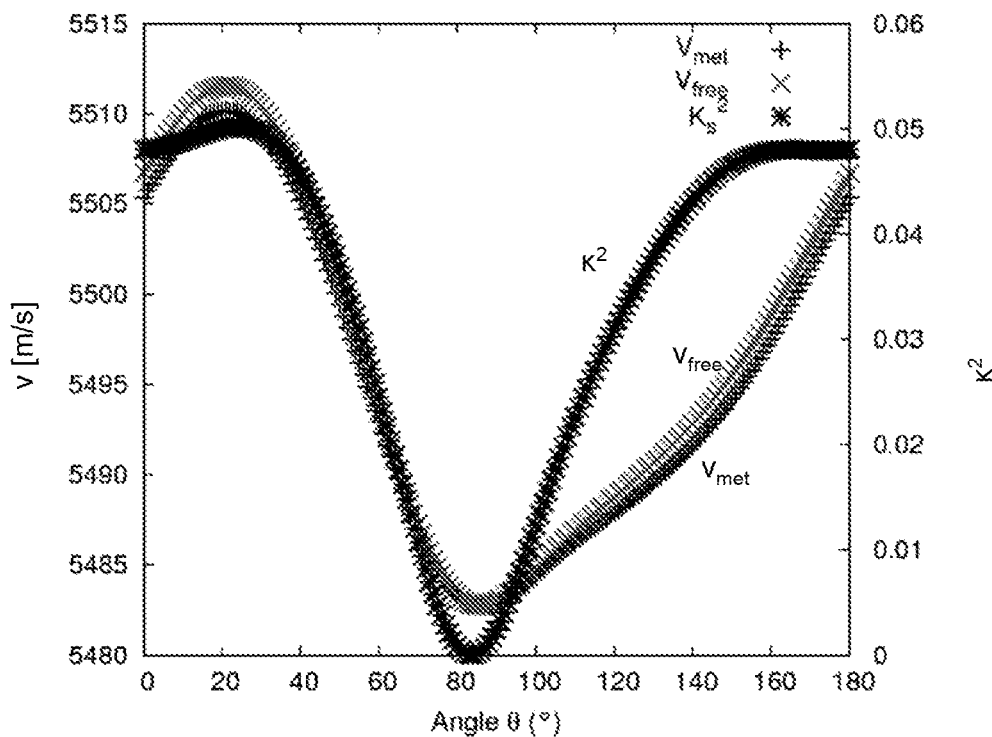
FIG. 36 shows angle-dependent velocities and the coupling coefficient for an embodiment of the electroacoustic component.

FIG. 36 shows the phase velocity $v_{free}$ for a free surface, the phase velocity $v_{met}$ for a metalized surface and the electroacoustic coupling coefficient κ$^2$ for a longitudinal mode of an electroacoustic component. The component has a 1.1 μm thick LiNbO$_3$ piezoelectric layer on a 3 μm thick SiO$_2$ substrate.

Figure 37:
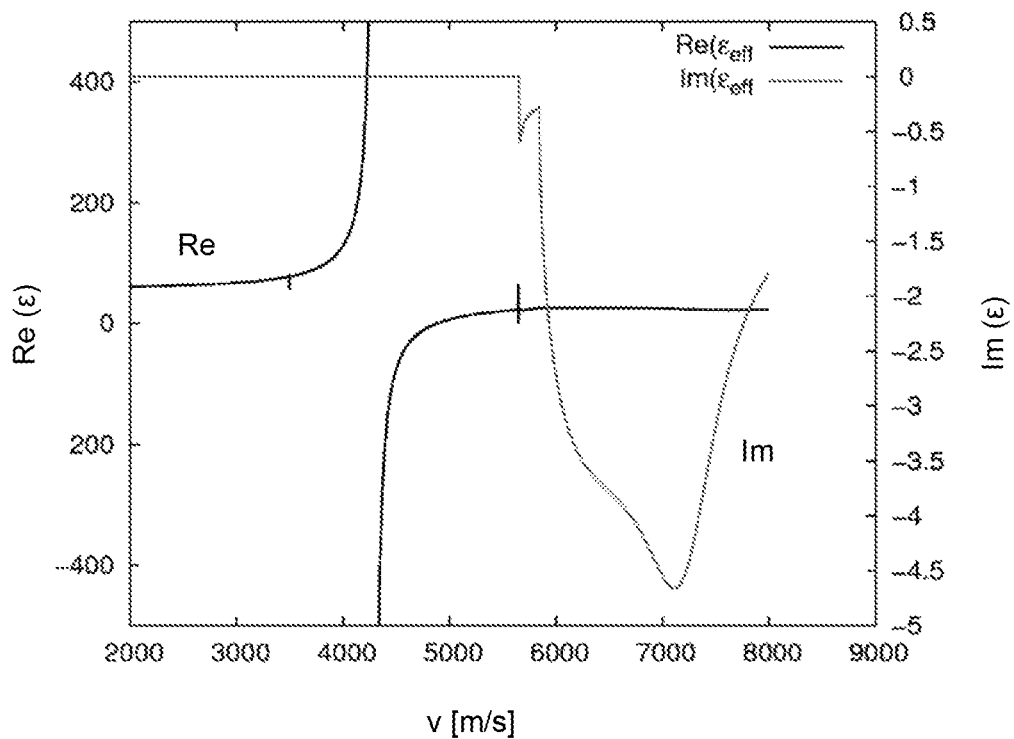
FIG. 37 shows the real part and the imaginary part (velocity-dependent) of the effective permittivity of an embodiment of the electroacoustic component.

FIG. 37 shows the real part Re and the imaginary part Im of the effective permittivity vs. the phase velocity v of an electroacoustic component with a (YX1)/52° LiNbO$_3$ piezoelectric layer on a Si wafer with a SiO$_2$ passivation layer in between at 600 MHz. The piezoelectric layer is 1.1 μm thick and the passivation layer is 3 μm thick.

Figure 38:
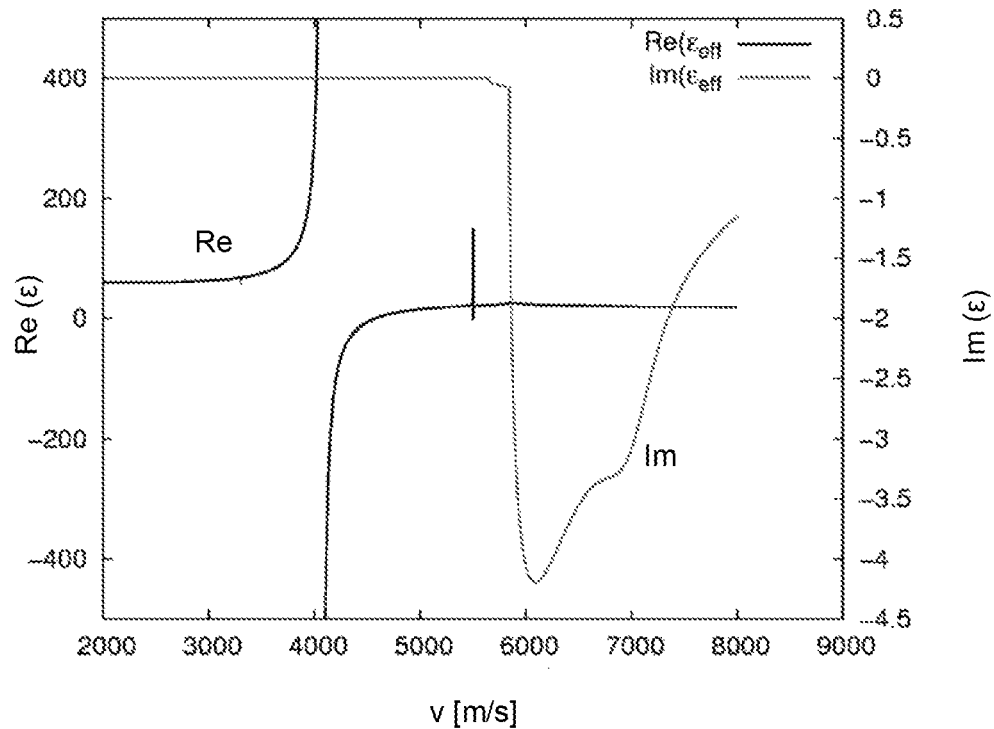
FIG. 38 shows the real part and the imaginary part (frequency-dependent) of the effective permittivity of an embodiment of the electroacoustic component.

FIG. 38 shows the real part Re and the imaginary part Im of the effective permittivity vs. the phase velocity v of an electroacoustic component with a (YX1)/52° LiNbO$_3$ piezoelectric layer on a Si wafer with a SiO$_2$ passivation layer in between at 400 MHz. The piezoelectric layer is 1 μm thick and the passivation layer is 1 μm thick.

Figure 39:
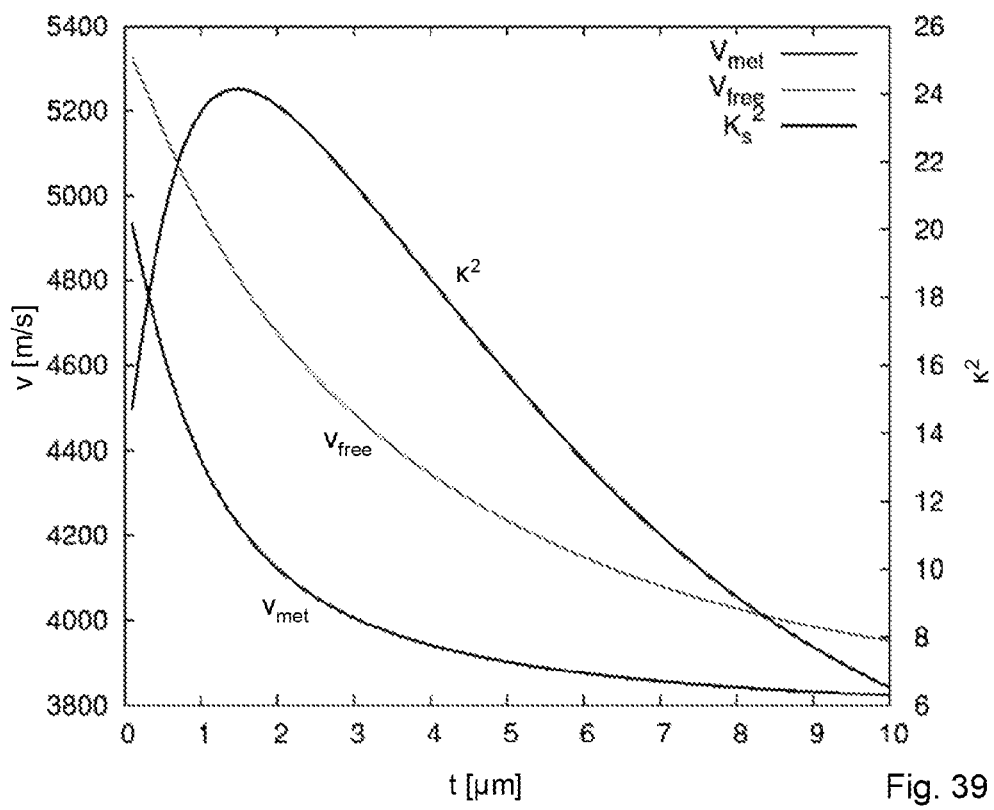
FIG. 39 shows velocities and the coupling coefficient vs. the thickness of the layer stack for an embodiment of the electroacoustic component.

FIG. 39 shows the phase velocity $v_{free}$ of a free surface, the phase velocity $v_{met}$ of a metalized surface and the coupling coefficient κ$^2$ vs. the thickness t of a layer stack comprising the piezoelectric layer and the passivation layer for an electroacoustic component. The piezoelectric layer is 1.1 μm thick and comprises (YX1)/52° LiNbO$_3$. The operation frequency is 400 MHz.

Figure 40:
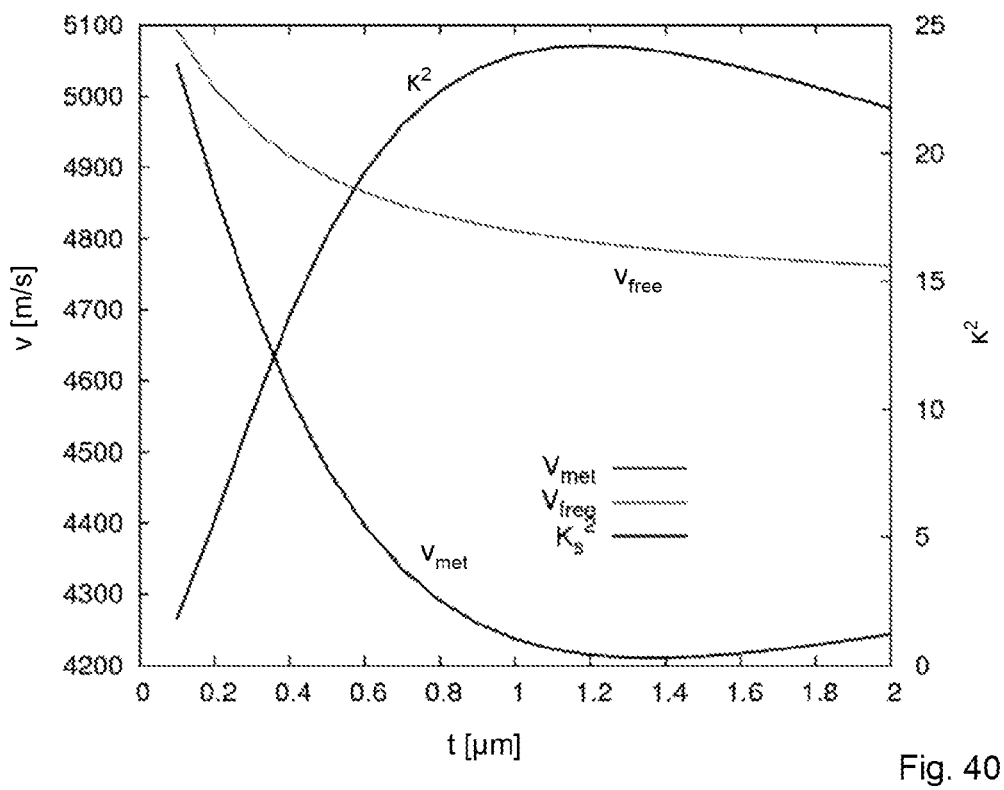
FIG. 40 shows velocities and the coupling coefficient vs. the thickness of the layer stack.

FIG. 40 shows the phase velocity $v_{free}$ of a free surface, the phase velocity $v_{met}$ of a metalized surface and the coupling coefficient κ$^2$ vs. the thickness t of a layer stack comprising the piezoelectric layer and the passivation layer for an electroacoustic component. The passivation layer is 1.5 μm thick and comprises SiO$_2$. The operation frequency is 400 MHz.

Figure 41:
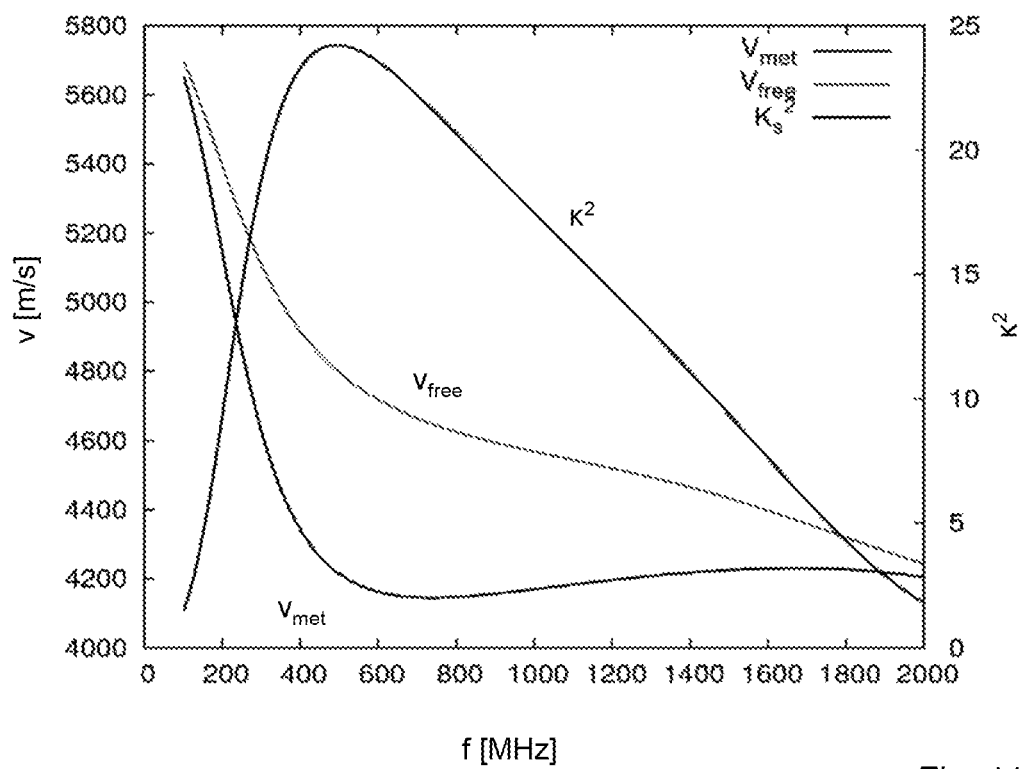
FIG. 41 shows frequency-dependent velocities and the coupling coefficient for an embodiment of the electroacoustic component.

FIG. 41 shows the phase velocity $v_{free}$ of a free surface, the phase velocity $v_{met}$ of a metalized surface and the coupling coefficient κ$^2$ vs. the frequency f of a layer stack comprising the piezoelectric layer and the passivation layer for an electroacoustic component. The piezoelectric layer is 1.2 µm thick and comprises (YX1)/52° LiNbO₃. The passivation layer is 1.5 µm thick and comprises SiO₂.

Figure 42:
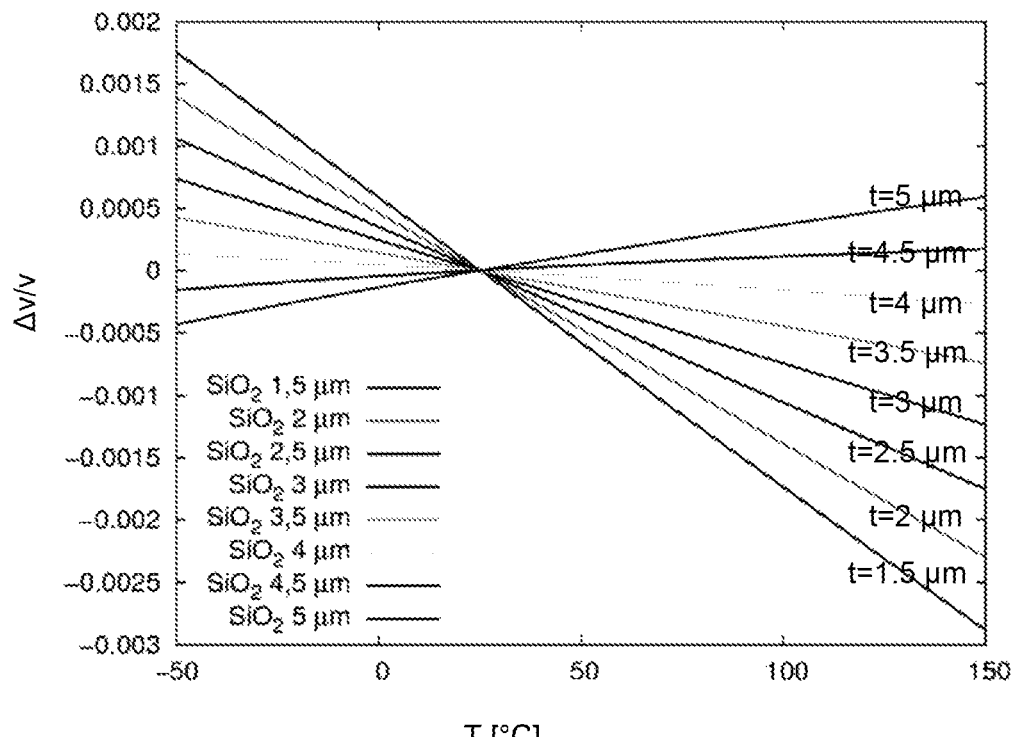
FIG. 42 shows temperature-dependent relative variations of the velocity for different thicknesses of the passivation layer for an embodiment of the electroacoustic component.

FIG. 42 shows the dependence of the relative velocity $\Delta v/v$ on the temperature T. Thus, different $\Delta v/v$ vs. temperature T lines for different passivation layer thicknesses are shown. For t=4 µm and t=4.5 µm, small temperature-induced velocity variations can be obtained.

Figure 43:
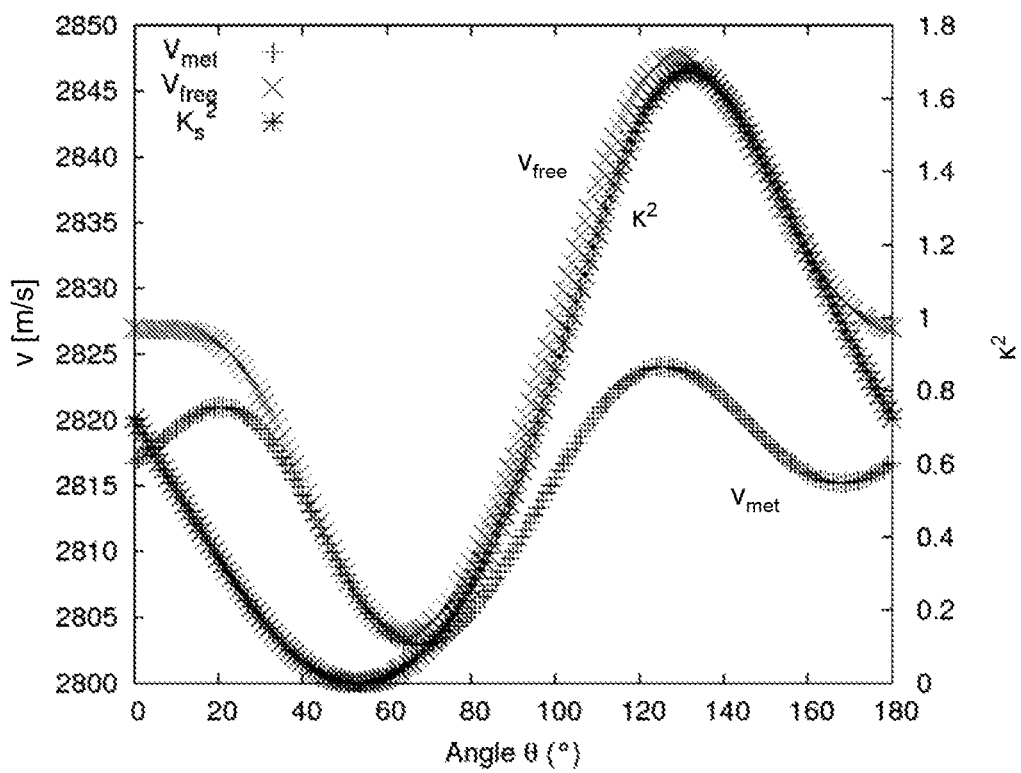
FIG. 43 shows angle-dependent velocities and the coupling coefficient for an embodiment of the electroacoustic component.

FIG. 43 shows the phase velocity $v_{free}$ for a free surface, the phase velocity $v_{met}$ for a metalized surface and the electroacoustic coupling coefficient $\kappa^2$ for an elliptically polarized mode of an electroacoustic component. The component has a 1.1 µm thick LiTaO₃ piezoelectric layer on a 1.5 µm thick SiO₂ substrate as a passivation layer.

Figure 44:
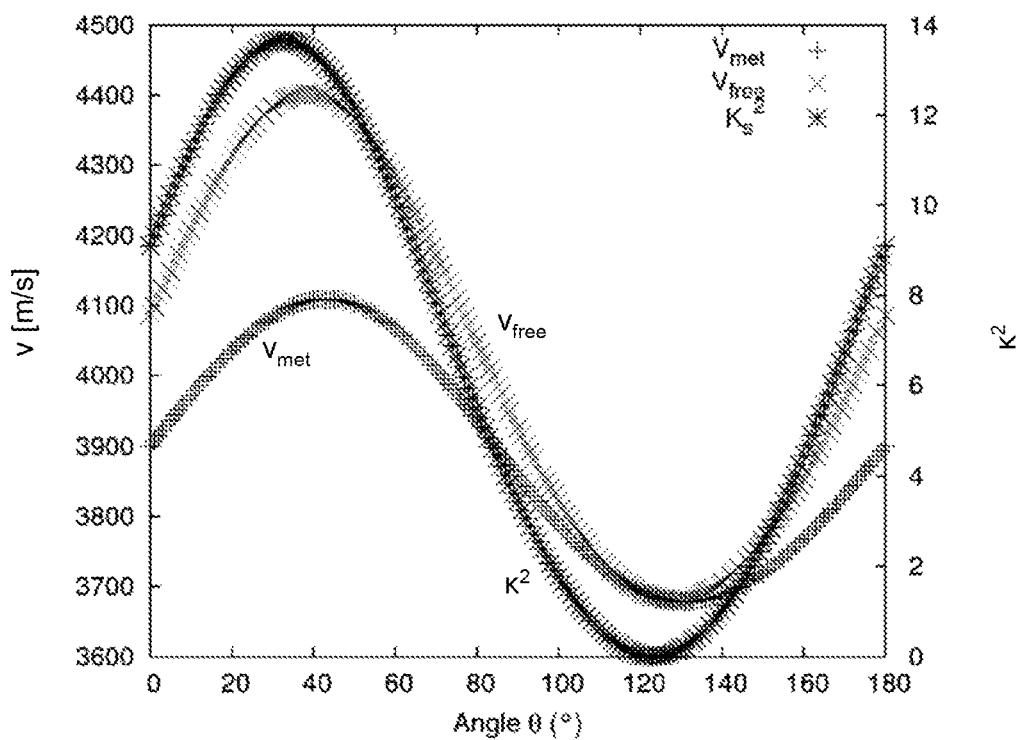
FIG. 44 shows angle-dependent velocities and the coupling coefficient for an embodiment of the electroacoustic component.

FIG. 44 shows the phase velocity $v_{free}$ for a free surface, the phase velocity $v_{met}$ for a metalized surface and the electroacoustic coupling coefficient $\kappa^2$ for a shear mode of an electroacoustic component. The component has a 1.1 µm thick LiTaO₃ piezoelectric layer on a 1.5 µm thick SiO₂ substrate.

Figure 45:
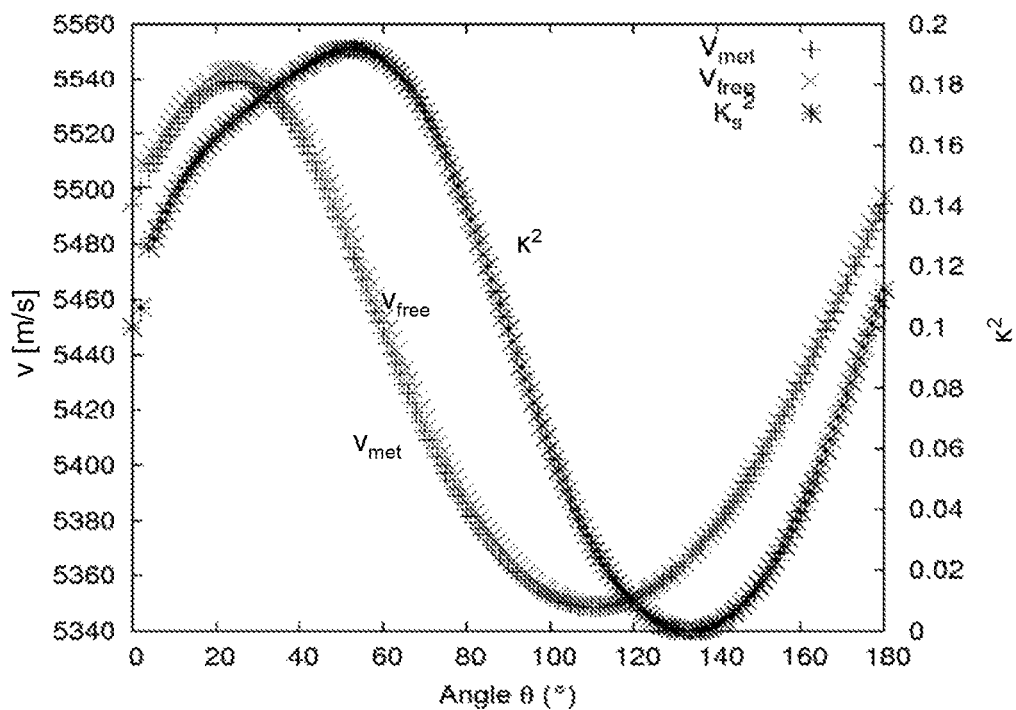
FIG. 45 shows angle-dependent velocities and the coupling coefficient for an embodiment of the electroacoustic component.

FIG. 45 shows the phase velocity $v_{free}$ for a free surface, the phase velocity $v_{met}$ for a metalized surface and the electroacoustic coupling coefficient $\kappa^2$ for a longitudinal mode of an electroacoustic component. The component has a 1.1 µm thick LiTaO₃ piezoelectric layer on a 1.5 µm thick SiO₂ substrate.

FIGS. 42 to 45 show parameters for an electroacoustic component with LiTaO₃ as the piezoelectric material. The proportion of the piezoelectric layer and the passivation layer is well balanced in FIGS. 43 to 45. The shown results are based on a (YX1)/48° LiTaO₃ material, which is commercially available and can help verifying computational results.

Figure 46:
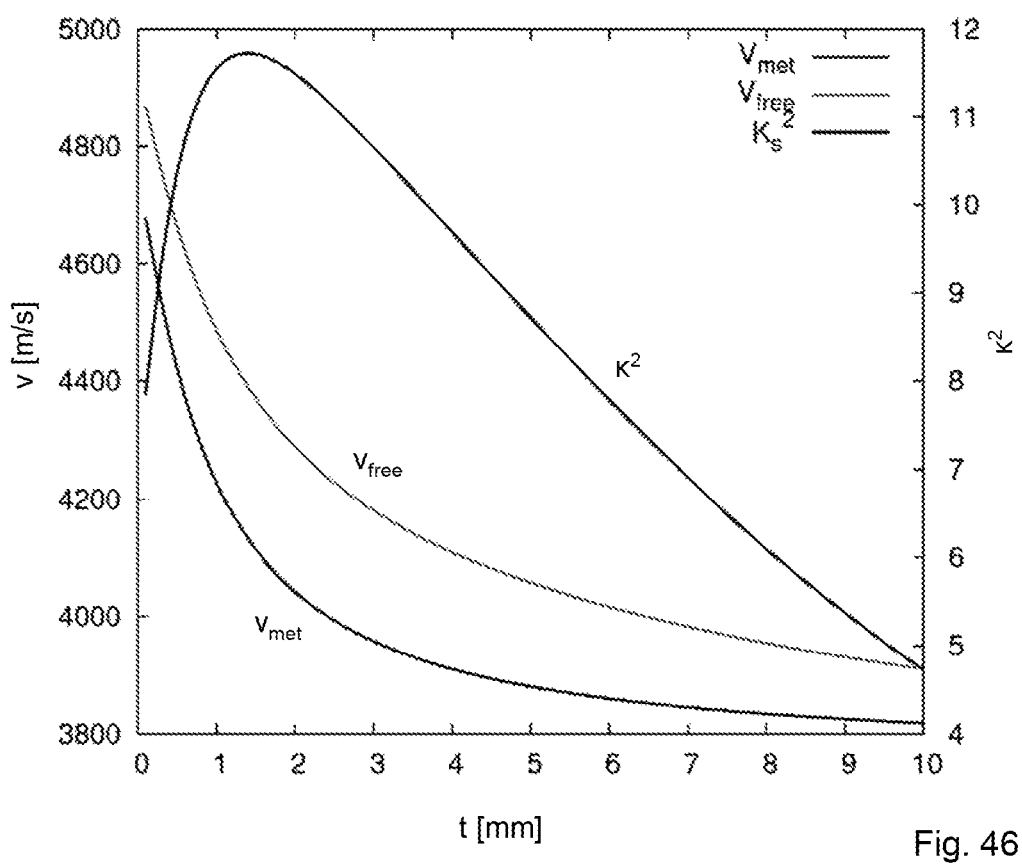
FIG. 46 shows the thickness-dependent velocities and the coupling coefficient for an embodiment of the electroacoustic component.

FIG. 46 shows the phase velocity $v_{free}$ of a free surface, the phase velocity $v_{met}$ of a metalized surface and the coupling coefficient $\kappa^2$ vs. the thickness t of a layer stack comprising the piezoelectric layer and the passivation layer for an electroacoustic component. The piezoelectric layer is 1 µm thick and comprises (YX1)/52° LiTaO₃. The operation frequency is 500 MHz.

Figure 47:
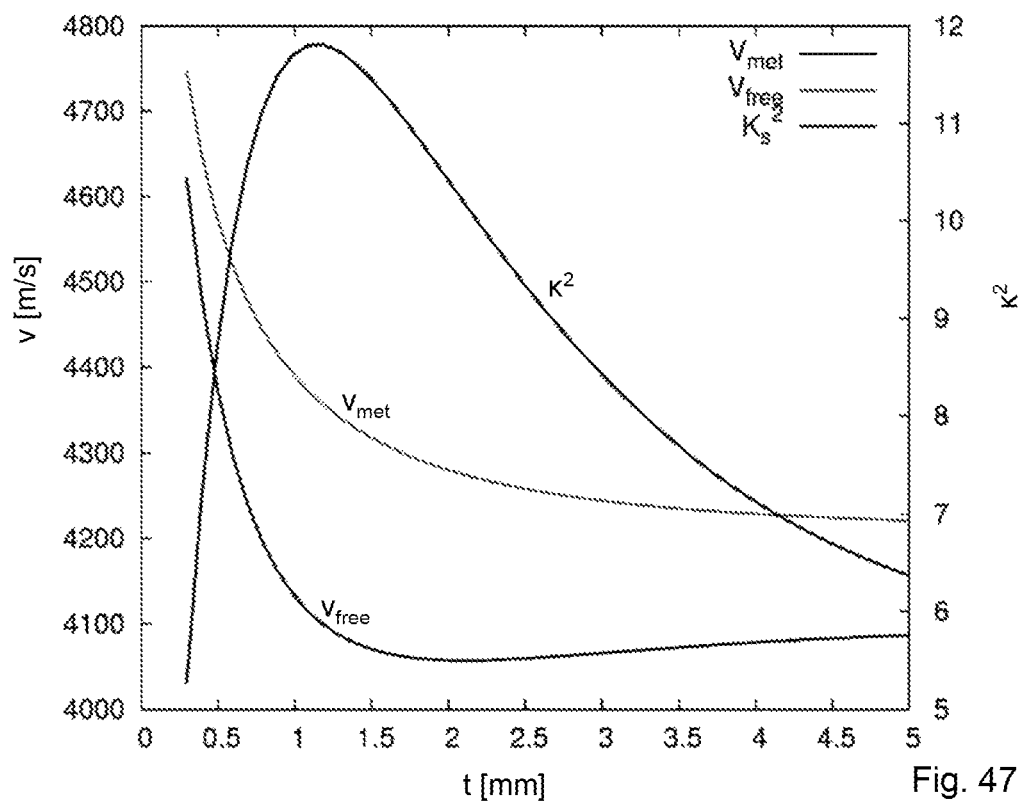
FIG. 47 shows the thickness-dependent velocities and the coupling coefficient for an embodiment of the electroacoustic component.

FIG. 47 shows the phase velocity $v_{free}$ of a free surface, the phase velocity $v_{met}$ of a metalized surface and the coupling coefficient $\kappa^2$ vs. the thickness t of a layer stack comprising the piezoelectric layer and the passivation layer for an electroacoustic component. The piezoelectric layer comprises (YX1)/52° LiTaO₃. The passivation layer is 1.4 µm thick and comprises SiO₂. The operation frequency is 400 MHz.

Figure 48:
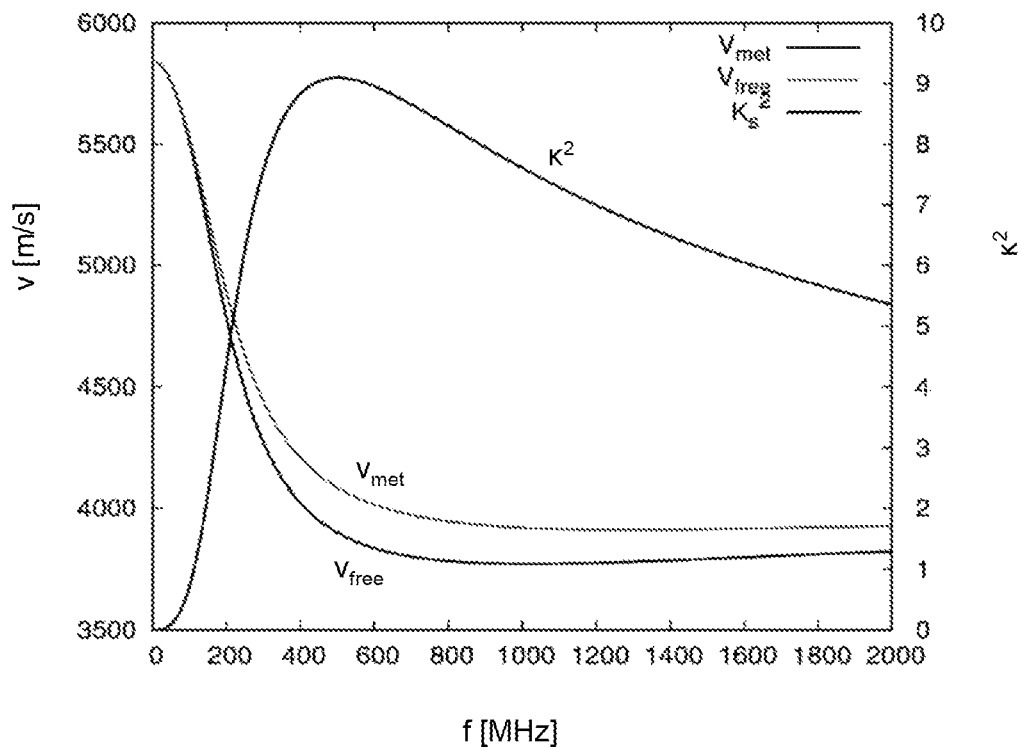
FIG. 48 shows frequency-dependent velocities and the coupling coefficient for an embodiment of the electroacoustic component.

FIG. 48 shows the phase velocity $v_{free}$ of a free surface, the phase velocity $v_{met}$ of a metalized surface and the coupling coefficient $\kappa^2$ vs. the frequency f for a layer stack comprising the piezoelectric layer and the passivation layer for an electroacoustic component. The piezoelectric layer is 1.2 µm thick and comprises (YX1)/52° LiNbO₃. The passivation layer is 1.4 µm thick and comprises SiO₂.

FIGS. 46 to 48 show parameters of electroacoustic components that allow favorable operating points. It was found that especially a small TCF can be obtained.

Figure 49:
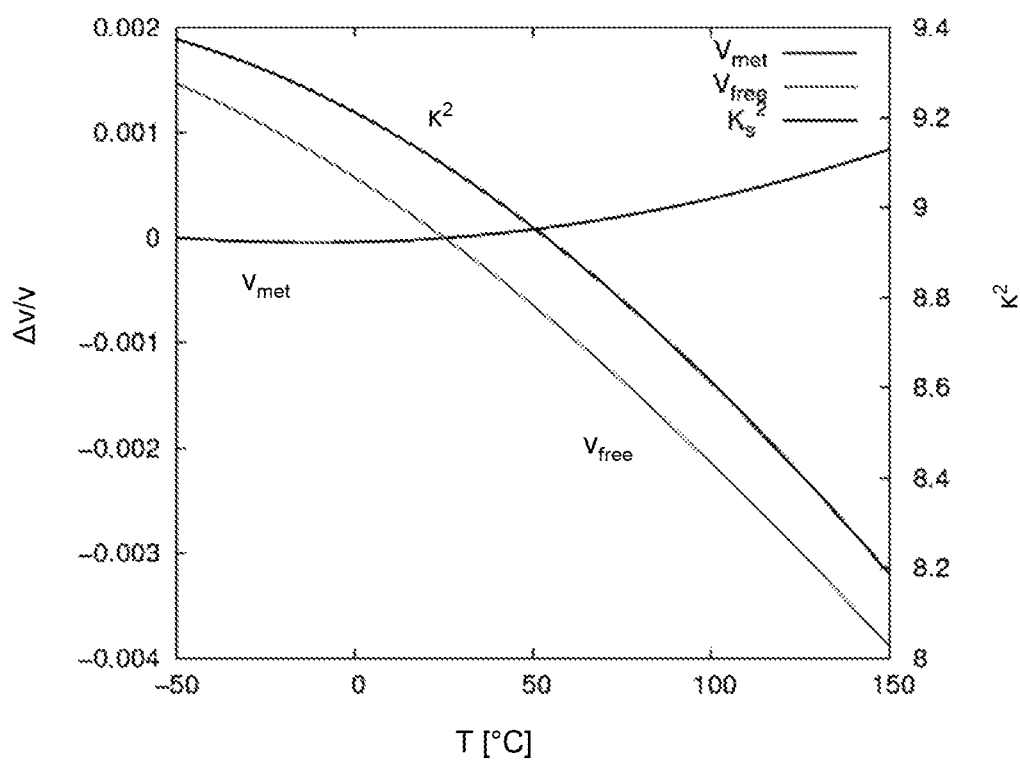
FIG. 49 shows relative velocity variations and the coupling coefficient (temperature-dependent) for an embodiment of the electroacoustic component.

FIG. 49 shows the dependence of the relative velocity $\Delta v/v$ on the temperature T for a free surface $v_{free}$ and for a metalized surface $v_{met}$ and of the coupling coefficient $\kappa^2$. The electroacoustic component has a 1.2 µm thick (YX1)/52° LiTaO₃ layer on a 1.4 µm SiO₂ layer.

Figure 50:
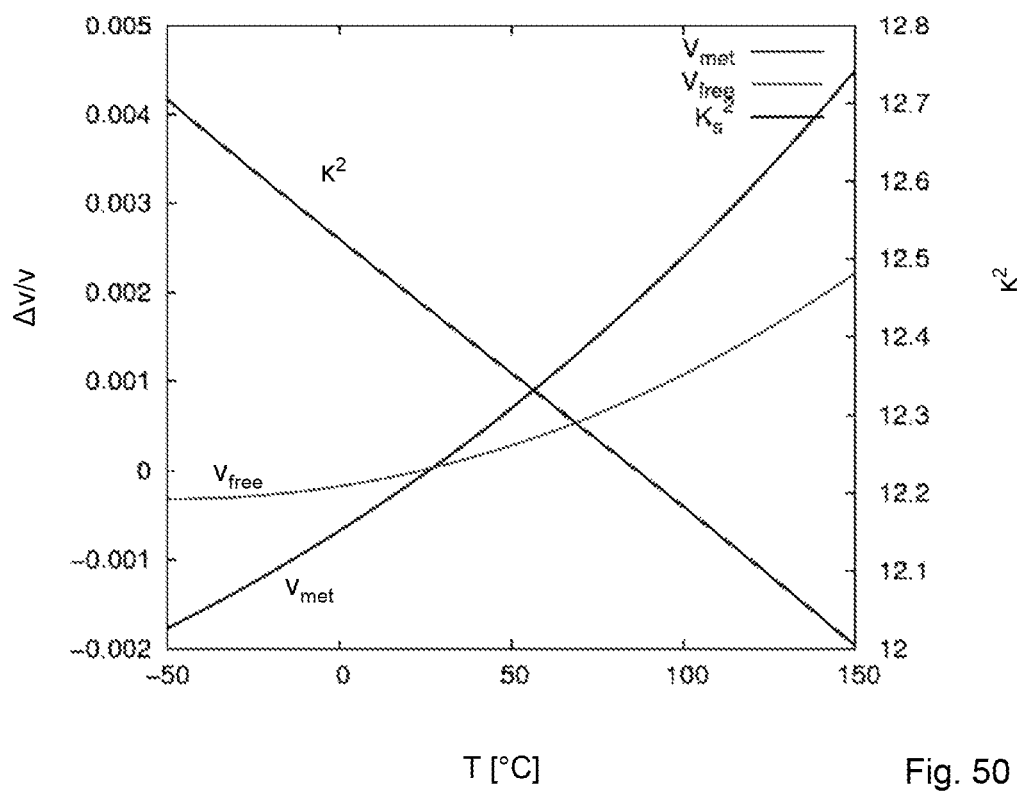
FIG. 50 shows temperature-dependent relative variations of velocities and the coupling coefficient for an embodiment of the electroacoustic component.

FIG. 50 shows the dependence of the relative velocity $\Delta v/v$ on the temperature T for a free surface $v_{free}$ and for a metalized surface $v_{met}$ and of the coupling coefficient $\kappa^2$. The component has a 1.2 µm thick (YX1)/48° LiTaO₃ layer on a 1.3 µm thick SiO₂ layer.

Figure 51:
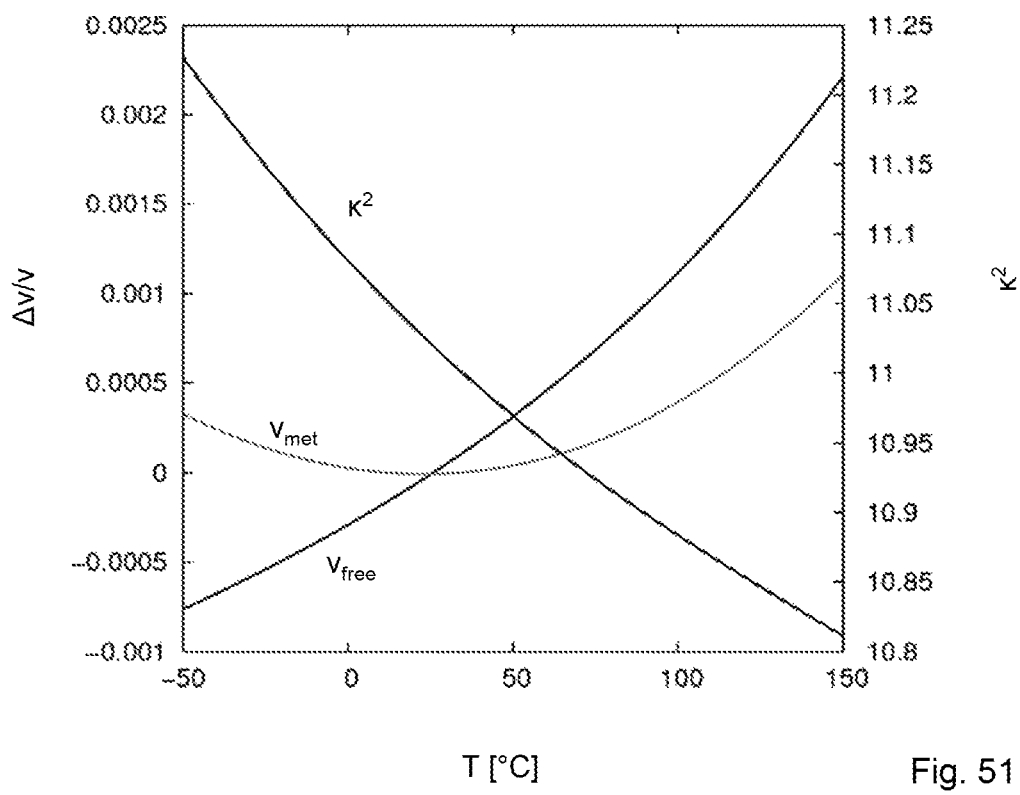
FIG. 51 shows temperature-dependent variations/relative variations of the velocities and the coupling coefficient for an embodiment of the electroacoustic component.

FIG. 51 shows the dependence of the relative velocity $\Delta v/v$ on the temperature T for a free surface $v_{free}$ and for a metalized surface $v_{met}$ and of the coupling coefficient $\kappa^2$. The component has a 2 µm thick (YX1)/48° LiTaO₃ layer on a 1.5 µm thick SiO₂ layer.

Figure 52:
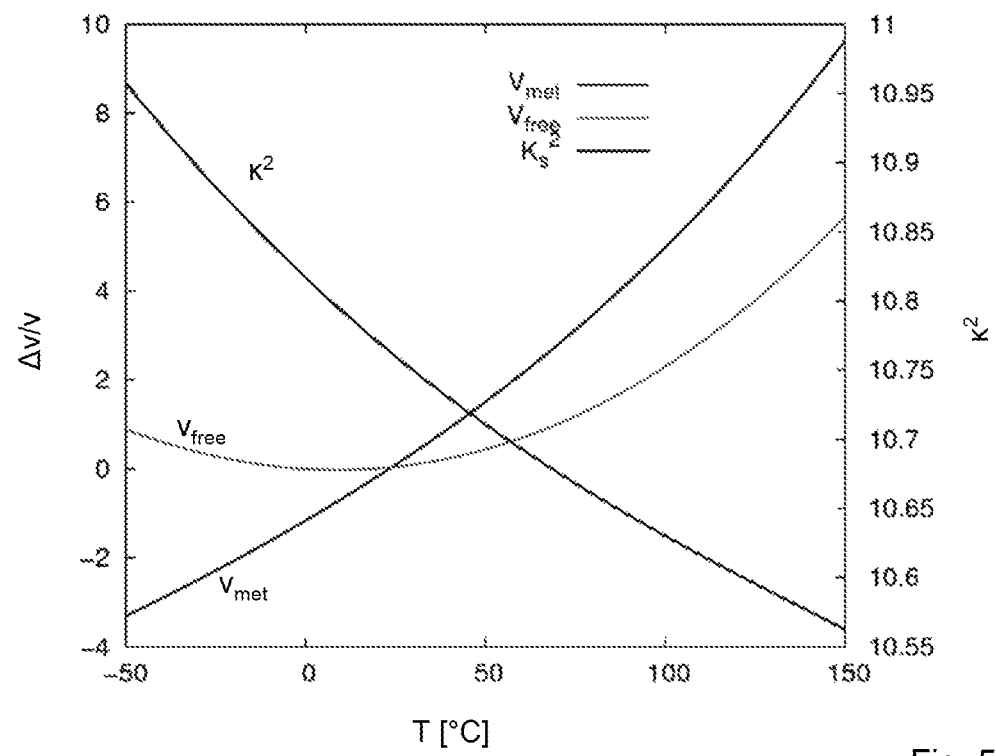
FIG. 52 shows temperature-dependent relative variations of the frequencies and the coupling coefficient for an embodiment of the electroacoustic component.

FIG. 52 shows the dependence of the relative velocity $\Delta v/v$ on the temperature T for a free surface $v_{free}$ and for a metalized surface $v_{met}$ and of the coupling coefficient $\kappa^2$. The component has a 2 µm thick (YX1)/48° LiTaO₃ layer on a 2 µm thick SiO₂ layer.

All four components shown in FIGS. 49 to 52 have an operating frequency of 500 MHz. The use of (YX1)/48° LiTaO₃ is favorable as the TCF can be minimized: A frequency-temperature turnover can be obtained near room temperature while $\kappa^2$ is larger that 10%. However, Rayleigh-wave-like contributions can still be present.

Figure 53:
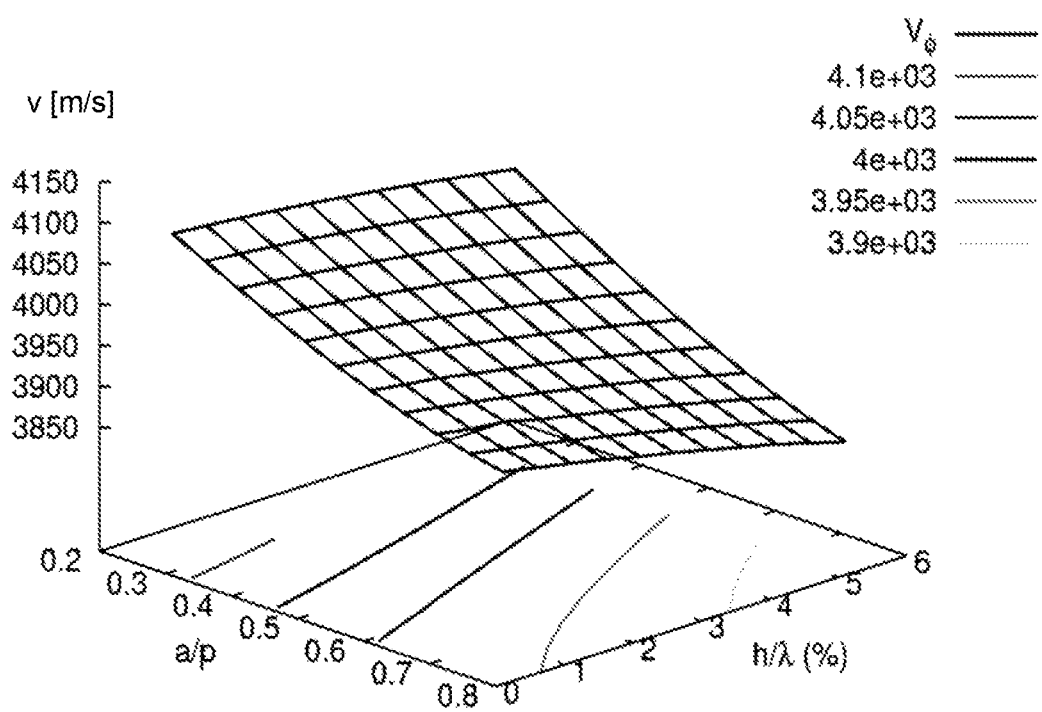
FIG. 53 shows the velocity vs. the metallization ratio and vs. the relative electrode height for an embodiment of the electroacoustic component.

FIG. 53 shows the phase velocity v vs. the metallization ratio a/p and vs. the relative electrode height h/λ for an electroacoustic component.

Figure 54:
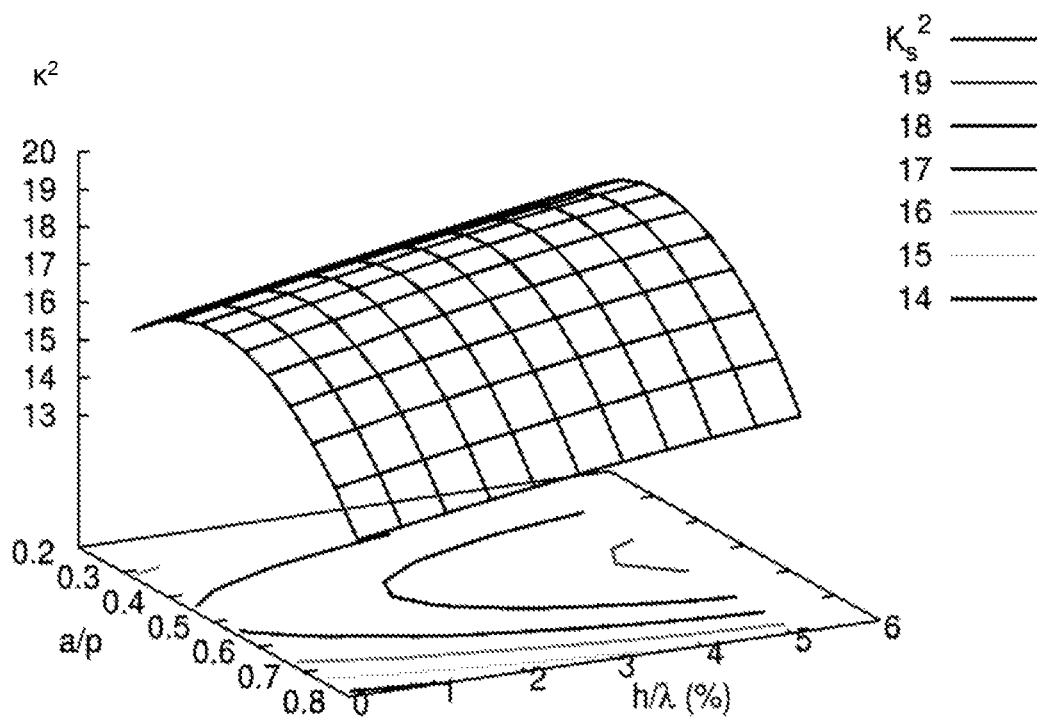
FIG. 54 shows the coupling coefficient vs. the metallization ratio and vs. the relative electrode height for an embodiment of the electroacoustic component.

FIG. 54 shows the coupling coefficient $\kappa^2$ vs. the metallization ratio a/p and vs. the relative electrode height for the component of FIG. 30.

Figure 55:
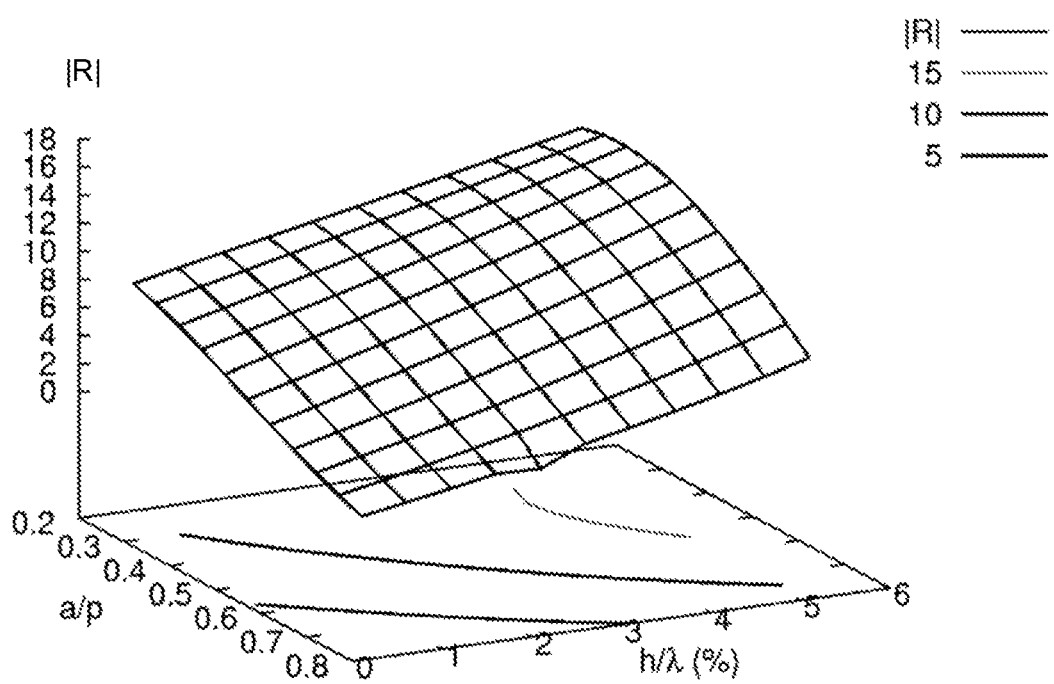
FIG. 55 shows the reflection coefficient vs. the metallization ratio and vs. the relative electrode height for an embodiment of the electroacoustic component.

FIG. 55 shows the reflection coefficient modulus |R| vs. the metallization ratio a/p and vs. the relative electrode height for the component of FIG. 30.

Figure 56:
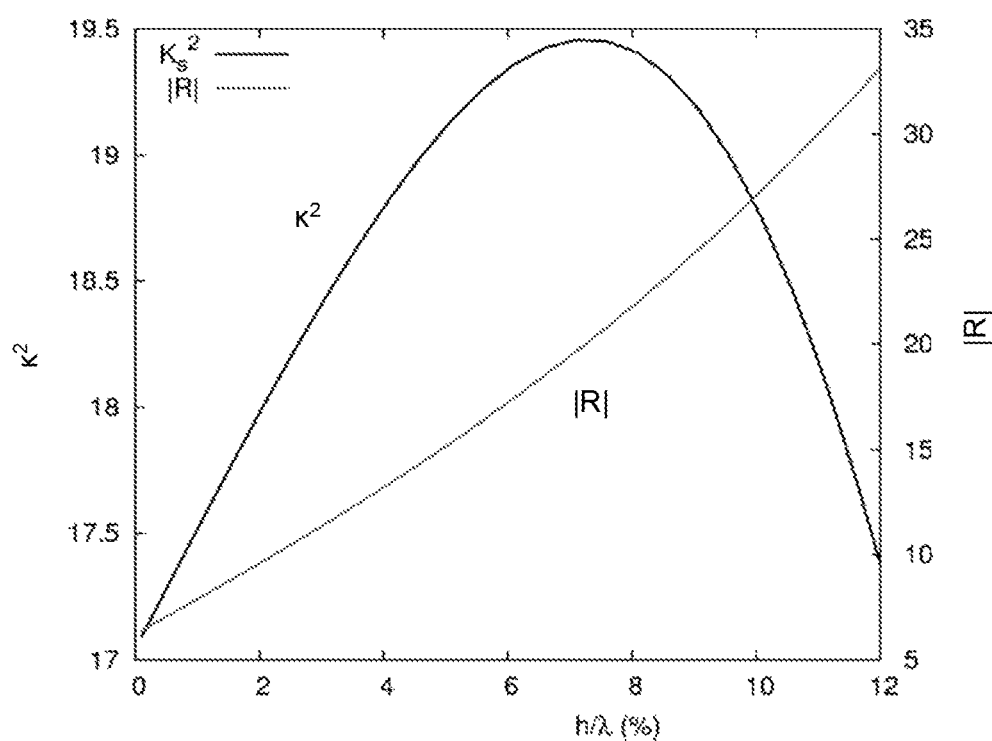
FIG. 56 shows the coupling coefficient and the reflection coefficient vs. the relative electrode height for an embodiment of the electroacoustic component.

FIG. 56 shows the optimum of the coupling coefficient κ2 and the reflection coefficient modulus |R|, both vs. the relative electrode height h/λ.

FIGS. 53 to 56 show parameters of the second shear mode of an electroacoustic component with a 1.4 µm thick (YX1)/52° LiNbO₃ as a piezoelectric material on a 5 µm thick SiO₂ passivation layer. The passivation layer is arranged on a quasi semi-infinite Si wafer. The pitch of Al electrodes is set to 5 µm yielding an operation frequency near 400 MHz.

Figure 57:
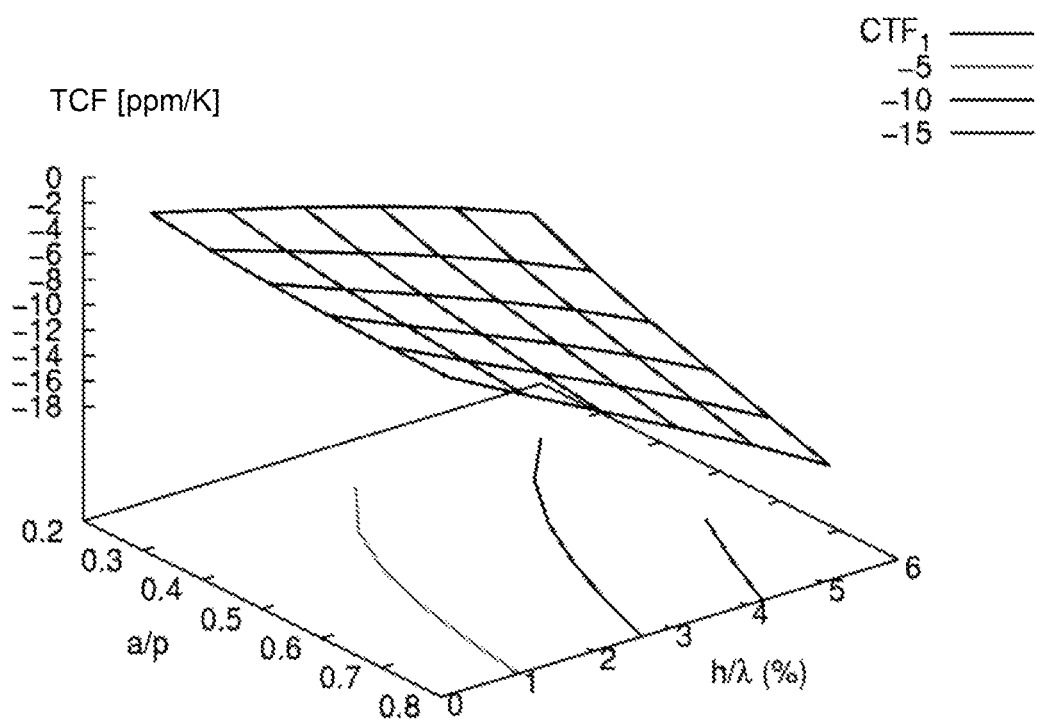
FIG. 57 shows the temperature coefficient of frequencies vs. the metallization ratio and vs. the relative electrode height for an embodiment of the electroacousticelectroacoustic component.

FIG. 57 shows the TCF of a component vs. the metallization ratio a/p and vs. the relative electrode height h/λ. The component has a 1.4 µm thick (YX1)/52° LiNbO₃ layer on a 5 µm thick SiO₂ layer which itself is arranged on a Si wafer.

Figure 58:
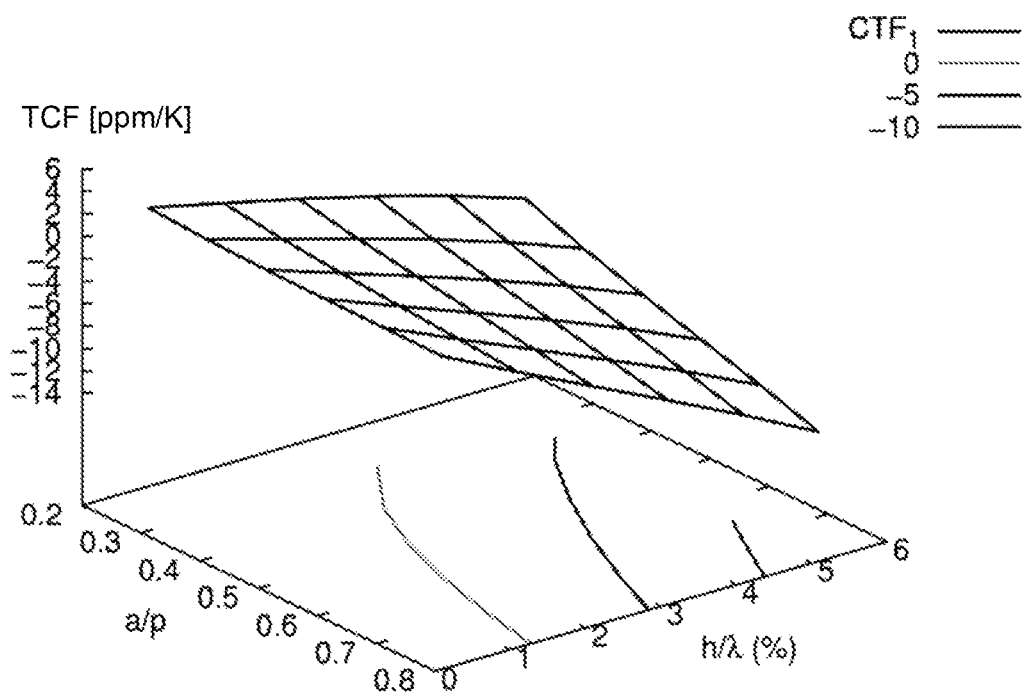
FIG. 58 shows the temperature coefficient of frequency vs. the metallization ratio and vs. the relative electrode height for an embodiment of the electroacoustic component.

FIG. 58 shows the TCF of a component vs. the metallization ratio a/p and vs. the relative electrode height ha. The component has a 1.2 µm thick (YX1)/52° LiNbO₃ layer on a 5 µm thick SiO₂ layer which itself is arranged on a Si wafer.

From FIGS. 57 and 58 it can be seen that a TCF close to 0 can be obtained, e.g. for relative electrode heights h/λ 7% at frequencies around 500 MHz. To obtain optimal parameters for higher frequencies, e.g. around 2 GHz, the thickness of the passivation layer can be increased, e.g. to up to 2 µm.

Figure 59:
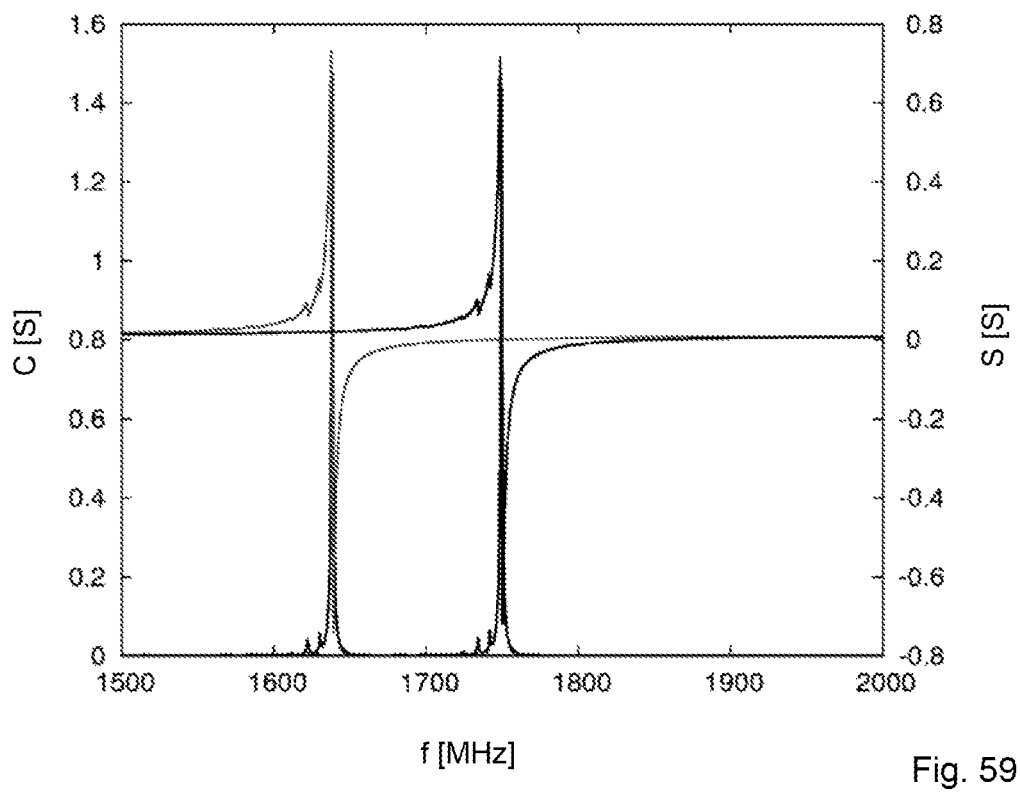
FIG. 59 shows the conductance and the susceptance (frequency-dependent) of an embodiment of the piezo electric component.

FIG. 59 shows the conductances C and susceptances S as means for the electric response of a series branch resonator and of a parallel branch resonator.

Figure 60:
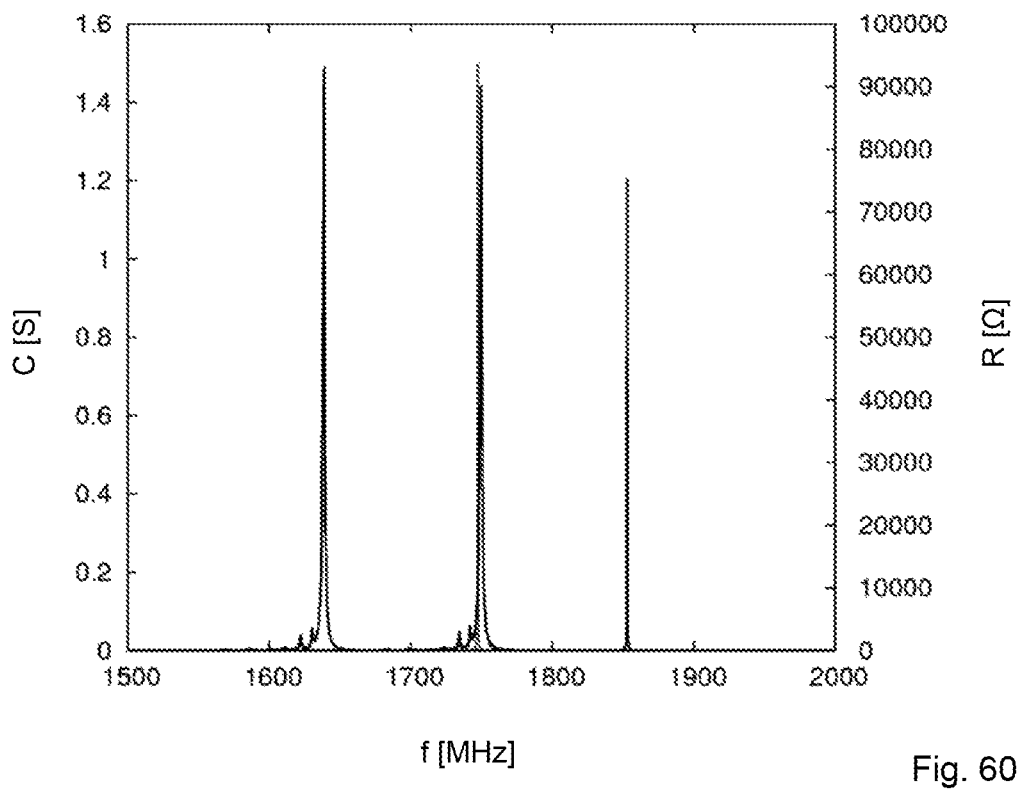
FIG. 60 shows the conductance and the resistance (frequency-dependent) of an embodiment of the electroacoustic component.

FIG. 60 shows the conductances C and resistances R of a series branch resonator and of a parallel branch resonator.

Figure 61:
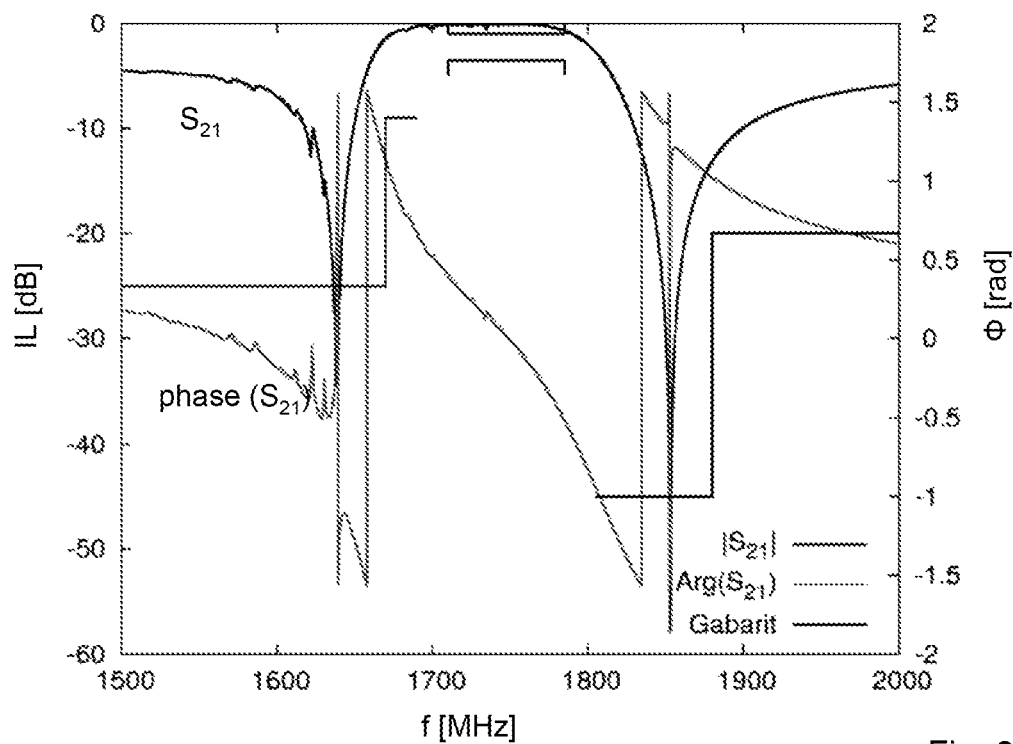
FIG. 61 shows the insertion loss and the phase (frequency-dependent) of a ladder-type filter structure.

FIG. 61 shows the transfer function $S_{21}$ and the respective phase of one cell of a ladder type filter structure comprising optimized parameters. Required specifications are fulfilled.

Figure 62:
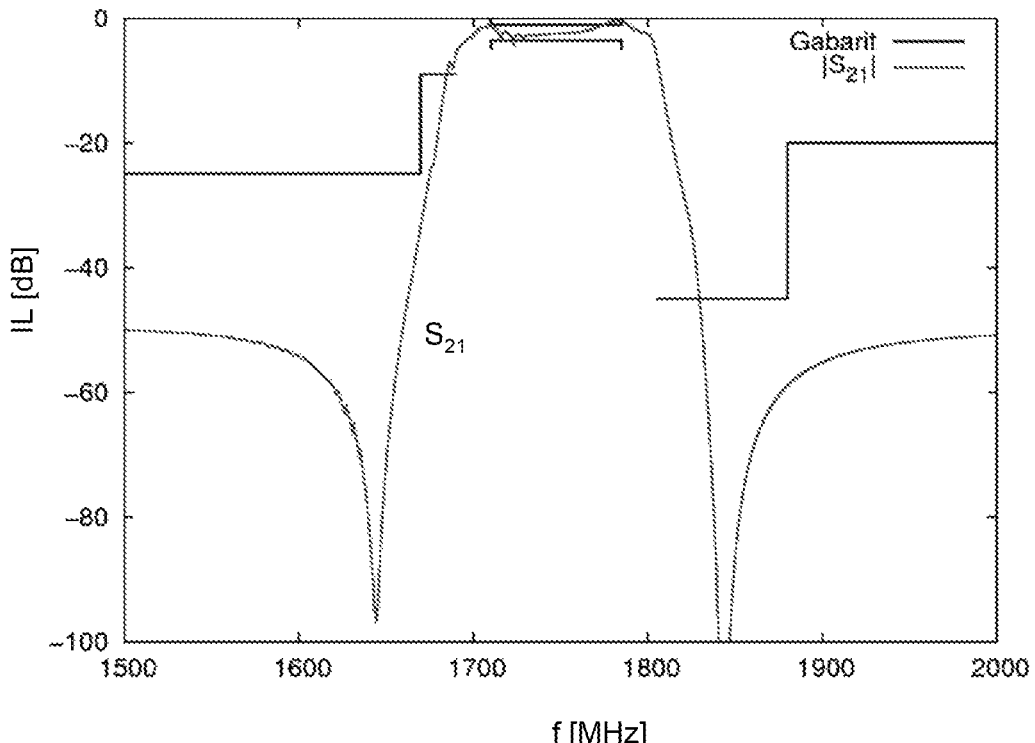
FIG. 62 shows the frequency-dependent insertion loss of a ladder-type filter structure with five cascaded elements.

FIG. 62 shows the transfer function $S_{21}$ of a ladder-type filter structure comprising 5 cells. Required specifications are fulfilled.

The invention claimed is:
1. An electroacoustic component comprising:
a carrier wafer with a passivation layer;

a piezoelectric layer disposed above the passivation layer; and an interdigitated transducer in an electrode layer disposed on the piezoelectric layer, wherein the electroacoustic component is configured to work with a shear mode.

2. The component of claim 1, wherein the piezoelectric layer comprises a $LiNbO_3$ single crystal substrate, wherein the substrate has a (YX1)/α cut with $50°<=α<=60°$ and a thickness of 0.25 μm, wherein the carrier wafer comprises Si, and wherein the passivation layer comprises $SiO_2$ and has a thickness of 0.25 μm.

3. The component of claim 1, wherein the piezoelectric layer comprises a $LiNbO_3$ single crystal substrate, wherein the substrate has a (YX1)/α cut with $50°<=α<=60°$ and a thickness of 0.35 μm, wherein the carrier wafer comprises Si, and wherein the passivation layer comprises $SiO_2$ and has a thickness of 0.25 μm.

4. The component of claim 1, wherein the piezoelectric layer comprises a $LiNbO_3$ single crystal substrate, wherein the substrate has a (YX1)/α cut with α=55° and a thickness of 0.25 μm, wherein the carrier wafer comprises Si, and wherein the passivation layer comprises $SiO_2$ and has a thickness of 0.25 μm.

5. The component of claim 1, wherein the piezoelectric layer comprises a $LiNbO_3$ single crystal substrate, wherein the substrate has a (YX1)/α cut with α=55° and a thickness of 0.35 μm, wherein the carrier wafer comprises Si, and wherein the passivation layer comprises $SiO_2$ and has a thickness of 0.55 μm.

6. The component of claim 1, wherein the piezoelectric layer comprises a $LiNbO_3$ single crystal substrate, wherein the interdigitated transducer has a metallization ratio of η=0.5, wherein a relative electrode height of h/λ=0.01, wherein the substrate has a (YX1)/α cut with α=55° and a thickness of 0.35 μm, wherein the carrier wafer comprises Si, wherein the passivation layer comprises $SiO_2$ and has a thickness of 0.55 μm.

7. The component of claim 1, wherein the piezoelectric layer comprises a $LiNbO_3$ single crystal substrate, wherein the interdigitated transducer has a metallization ratio of η=0.5, wherein a relative electrode height of h/λ=0.01, wherein the substrate has a (YX1)/α cut with α=55° and a thickness of 0.175 μm, wherein the carrier wafer comprises Si, and wherein the passivation layer comprises $SiO_2$ and has a thickness of 0.275 μm.

8. The component of claim 1, wherein the piezoelectric layer comprises a $LiNbO_3$ single crystal substrate, wherein the interdigitated transducer has a metallization ratio of $0.4<=η<=0.5$, wherein a relative electrode height of h/λ=0.05, wherein the substrate has a (YX1)/α cut with α=55° and a thickness of 0.35 μm, wherein the carrier wafer comprises Si, and wherein the passivation layer comprises $SiO_2$ and has a thickness of 0.55 μm.

9. The component of claim 1, wherein the piezoelectric layer comprises a $LiNbO_3$ single crystal substrate, wherein the interdigitated transducer has a metallization ratio of η=0.8, wherein the substrate has a (YX1)/α cut with α=52°, wherein the carrier wafer comprises Si, and wherein the passivation layer comprises $SiO_2$.

10. The component of claim 1, wherein the piezoelectric layer comprises a $LiNbO_3$ single crystal substrate, wherein the substrate has a (YX1)/α cut with α=52° and a thickness of 0.2 μm, wherein the carrier wafer comprises Si, and wherein the passivation layer comprises $SiO_2$ and has a thickness of 0.4 μm.

11. The component of claim 1, wherein the piezoelectric layer comprises a $LiNbO_3$ single crystal substrate, wherein the substrate has a (YX1)/α cut with α=55° and a thickness of 0.35 μm, wherein the carrier wafer comprises Si, and wherein the passivation layer comprises $SiO_2$ and has a thickness of 0.55 μm.

12. The component of claim 1, wherein the piezoelectric layer comprises a $LiNbO_3$ single crystal substrate, wherein the substrate has a (YX1)/α cut with α=52° and a thickness of 0.20 μm, wherein the carrier wafer comprises Si, and wherein the passivation layer comprises $SiO_2$ and has a thickness of 0.40 μm.

13. The component of claim 1, wherein the piezoelectric layer comprises a $LiTaO_3$ single crystal substrate.

14. The component of claim 13, wherein the substrate has a (YX1)/α cut with α=48° and a thickness of 0.465 μm, and wherein the passivation layer comprises $SiO_2$ and has a thickness of 0.10 μm.

15. The component of claim 13, wherein the substrate has a (YX1)/α cut with α=55°, wherein the passivation layer comprises $SiO_2$ and has a thickness of 1.0 μm, and wherein the component is further configured to work with leaky surface acoustic wave (LSAW), and wherein the carrier wafer has a thickness >=350 μm.

16. The component of claim 13, wherein the substrate has a (YX1)/α cut with α=48° and a thickness of 0.465 μm, and wherein the passivation layer comprises $SiO_2$ and has a thickness of 1.0 μm.

17. The component of claim 13, wherein the carrier wafer is configured to be a wave-guiding material.

18. The component of claim 13, further comprising a Bragg mirror structure below the substrate.

19. The component of claim 18, where the carrier wafer comprises Si, sapphire, or diamond-carbon.

20. The component of claim 1, wherein the piezoelectric layer comprises $LiNbO_3$, has a (YX1)/α cut with $45°<=α<=60°$ and a thickness of 1.1 μm, wherein the passivation layer comprises $SiO_2$ and has a thickness of 3 μm, and wherein the carrier wafer has a thickness >=350 μm.

21. The component of claim 1, wherein the piezoelectric layer comprises $LiNbO_3$ and has a (YX1)/α cut with α=52°.

22. The component of claim 1, wherein the piezoelectric layer comprises $LiNbO_3$ and has a (YX1)/α cut with α=52° and a thickness of 1.0 μm, wherein the passivation layer comprises $SiO_2$ and has a thickness of 1.0 μm, and wherein the carrier wafer has a thickness >=350 μm.

23. The component of claim 1, wherein the piezoelectric layer comprises $LiNbO_3$ and has a (YX1)/α cut with α=52° and a thickness of 1.1 μm, wherein the carrier wafer has a thickness >=350 μm.

24. The component of claim 1, wherein the piezoelectric layer comprises $LiNbO_3$ and has a (YX1)/α cut with α=52°, wherein the passivation layer comprises $SiO_2$ and has a thickness of 1.5 μm, and wherein the carrier wafer has a thickness >=350 μm.

25. The component of claim 1, wherein the piezoelectric layer comprises $LiNbO_3$ and has a (YX1)/α cut with α=52° and a thickness of 1.2 μm, wherein the passivation layer comprises $SiO_2$ and has a thickness of 1.5 μm, and wherein the carrier wafer has a thickness >=350 μm.

26. The component of claim 1, wherein the piezoelectric layer comprises $LiNbO_3$ and has a (YX1)/α cut with α=52° and a thickness of 1.2 μm, wherein the passivation layer comprises $SiO_2$ and has a thickness >=4.0 μm, and wherein the carrier wafer has a thickness >=350 μm.

27. The component of claim 1, wherein the piezoelectric layer comprises $LiTaO_3$ and has a (YX1)/α cut with $48°<=α<=52°$, wherein the passivation layer comprises SiO₂ and has half the thickness of the carrier wafer, and wherein the carrier wafer has a thickness >=350 µm.

28. The component of claim 1, wherein the piezoelectric layer comprises LiTaO₃ and has a (YX1)/α cut with 48°<=α<=52° and a thickness of 1.2 µm, wherein the passivation layer comprises SiO₂ and has a thickness of 1.4 µm, and wherein the carrier wafer has a thickness >=350 µm.

29. The component of claim 1, wherein the piezoelectric layer comprises LiTaO₃ and has a (YX1)/α cut with α=48° and a thickness of 1.2 µm, wherein the passivation layer comprises SiO₂ and has a thickness of 1.3 µm, and wherein the carrier wafer has a thickness >=350 µm.

30. The component of claim 1, wherein the piezoelectric layer comprises LiTaO₃ and has a (YX1)/α cut with α=48° and a thickness of 2 µm, wherein the passivation layer comprises SiO₂ and has a thickness of 1.5 µm, and wherein the carrier wafer has a thickness >=350 µm.

31. The component of claim 1, wherein the piezoelectric layer comprises LiTaO₃ and has a (YX1)/α cut with α=48° and a thickness of 2 µm, wherein the passivation layer comprises SiO₂ and has a thickness of 2 µm, and wherein the carrier wafer has a thickness >=350 µm.

32. The component of claim 1, wherein the piezoelectric layer comprises LiNbO₃ and has a thickness of 1.4 µm, wherein the passivation layer comprises SiO₂ and has a thickness of 5 µm, wherein the interdigitated transducer has a metallization ratio of 0.4<=η<=0.5 and a relative electrode height h/λ=0.068, and wherein the carrier wafer has a thickness >=350 µm.

33. The component of claim 1, wherein the piezoelectric layer comprises LiNbO₃ and has a thickness of 1.2 µm, wherein the passivation layer comprises SiO₂ and has a thickness of 5 µm, wherein the interdigitated transducer has a metallization ratio of 0.4<=η1<=0.5 and a relative electrode height h/λ=0.068, and wherein the carrier wafer has a thickness >=350 µm.

34. The component of claim 1, wherein the electroacoustic component is an RF-filter operating at a center frequency 1710 MHz <=f<=1785 MHz.

35. An electroacoustic component comprising;
a carrier wafer with a passivation layer;
a piezoelectric layer disposed above the passivation layer;
an interdigitated transducer disposed in an electrode layer on the piezoelectric layer; and
a Bragg mirror structure disposed below the piezoelectric layer, wherein the electroacoustic component is configured to work with a higher order Lamb mode.

* * * * *